（12） United States Patent
Shinozaki et al.

(10) Patent No.: US 12,052,001 B2
(45) Date of Patent: *Jul. 30, 2024

(54) RADIO-FREQUENCY MODULE AND COMMUNICATION DEVICE

(71) Applicant: Murata Manufacturing Co., Ltd., Nagaokakyo (JP)

(72) Inventors: Takayuki Shinozaki, Nagaokakyo (JP); Shigeru Tsuchida, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 330 days.

This patent is subject to a terminal disclaimer.

(21) Appl. No.: 17/540,264

(22) Filed: Dec. 2, 2021

(65) Prior Publication Data

US 2022/0094308 A1    Mar. 24, 2022

Related U.S. Application Data

(63) Continuation of application No. PCT/JP2020/024432, filed on Jun. 22, 2020.

(30) Foreign Application Priority Data

Jul. 9, 2019  (JP) ................................ 2019-127756
Apr. 22, 2020 (JP) ................................ 2020-076279

(51) Int. Cl.
*H04B 1/04*    (2006.01)
*H01Q 1/22*    (2006.01)
(Continued)

(52) U.S. Cl.
CPC .............. *H03F 1/56* (2013.01); *H01Q 1/243* (2013.01); *H01Q 1/38* (2013.01); *H03F 3/245* (2013.01);
(Continued)

(58) Field of Classification Search
CPC ...... H03F 1/56; H03F 3/245; H03F 2200/222; H03F 2200/451; H04B 1/00; H04B 1/04;
(Continued)

(56) References Cited

U.S. PATENT DOCUMENTS 10,643,962 B1 *  5/2020  Ichitsubo ................ H03F 3/72
2004/0041256 A1  3/2004  Takehara et al.
(Continued)

FOREIGN PATENT DOCUMENTS

CN    106298759 A    1/2017
CN    106487394 A    3/2017
(Continued)

OTHER PUBLICATIONS

Chinese Office Action issued Oct. 9, 2022 in corresponding Chinese Patent Application No. 202080049941.8, 6 pages.
(Continued)

*Primary Examiner* — Blane J Jackson
(74) *Attorney, Agent, or Firm* — XSENSUS LLP

(57) ABSTRACT

A radio-frequency module includes a mounting substrate, a power amplifier, and a controller. The mounting substrate has first and second main surfaces opposing each other. The power amplifier is disposed on one of the first and second main surfaces (the first main surface, for example) of the mounting substrate. The controller is disposed on the other one of the first and second main surfaces (the second main surface, for example) of the mounting substrate. The controller controls the power amplifier.

20 Claims, 21 Drawing Sheets

(51) Int. Cl.
*H01Q 1/24* (2006.01)
*H01Q 1/38* (2006.01)
*H03F 1/56* (2006.01)
*H03F 3/24* (2006.01)
*H04B 1/00* (2006.01)
*H04B 1/40* (2015.01)

(52) U.S. Cl.
CPC ......... *H04B 1/0057* (2013.01); *H04B 1/0078* (2013.01); *H04B 1/40* (2013.01); *H03F 2200/222* (2013.01); *H03F 2200/387* (2013.01); *H03F 2200/451* (2013.01)

(58) Field of Classification Search
CPC .. H04B 1/0053; H04B 1/0057; H04B 1/0078; H04B 1/0087; H01Q 1/243; H01Q 1/38; H01Q 1/22; H01Q 2001/0408
See application file for complete search history.

(56) References Cited

U.S. PATENT DOCUMENTS

| | | | |
|---|---|---|---|
| 2016/0094213 A1* | 3/2016 | Liu ...................... | H03K 17/005 455/73 |
| 2016/0261292 A1 | 9/2016 | Ikuma et al. | |
| 2021/0091796 A1* | 3/2021 | Shinozaki ............ | H04B 1/0053 |
| 2021/0091797 A1* | 3/2021 | Shinozaki ............ | H04L 5/1461 |
| 2021/0091800 A1* | 3/2021 | Sawada ................ | H03F 3/72 |
| 2021/0091802 A1* | 3/2021 | Sawada ................ | H03F 1/565 |
| 2021/0091807 A1* | 3/2021 | Shinozaki ............ | H04B 1/0475 |
| 2021/0092209 A1* | 3/2021 | Shinozaki ............... | H03F 3/245 |
| 2021/0092213 A1* | 3/2021 | Shinozaki ........... | H04M 1/0277 |
| 2021/0135693 A1* | 5/2021 | Horita .................. | H04B 1/18 |
| 2021/0288679 A1* | 9/2021 | Sawada ................ | H04B 1/03 |
| 2021/0306017 A1* | 9/2021 | Matsumoto .......... | H04B 1/0475 |
| 2021/0306018 A1* | 9/2021 | Matsumoto ........... | H04B 1/525 |
| 2021/0336642 A1* | 10/2021 | Matsumoto .............. | H04B 1/44 |
| 2022/0094373 A1* | 3/2022 | Tsuchida .............. | H04B 1/0057 |

FOREIGN PATENT DOCUMENTS

| | | |
|---|---|---|
| JP | 2018-181943 A | 11/2018 |
| WO | 2007/129716 A1 | 11/2007 |
| WO | 2012/096354 A1 | 7/2012 |
| WO | 2012/129819 A1 | 10/2012 |
| WO | 2018/088410 A1 | 5/2018 |
| WO | 2018/187245 A1 | 10/2018 |
| WO | 2019/065311 A1 | 4/2019 |

OTHER PUBLICATIONS

International Search Report and Written Opinion mailed on Aug. 11, 2020, received for PCT Application PCT/JP2020/024432, Filed on Jun. 22, 2020, 8 pages including English Translation.
Office Action issued on Nov. 15, 2022, in corresponding Korean patent Application No. 10-2021-7041401, 4 pages.
English translation of the Written Opinion mailed on Aug. 11, 2020, received for PCT Application PCT/JP2020/024432.
Office Action issued on Jun. 16, 2023, in corresponding Chinese patent Application No. 202080049941.8, 7 pages.
German Office Action issued Dec. 23, 2023 in corresponding German Patent Application No. 11 2020 003 287.6, 11 pages.

* cited by examiner

RADIO-FREQUENCY MODULE AND COMMUNICATION DEVICE

CROSS-REFERENCE TO RELATED APPLICATIONS

The present application is a continuation of and claims priority to PCT/JP2020/024432, filed Jun. 22, 2020, which claims priority to JP 2019-127756, filed Jul. 9, 2019, and JP 2020-076279, filed Apr. 22, 2020, the entire contents of each are incorporated herein by its reference.

BACKGROUND

1. Field of the Disclosure

The present disclosure generally relates to a radio-frequency module and a communication device, and more particularly, to a radio-frequency module including a power amplifier and a communication device including the radio-frequency module.

2. Description of the Related Art

Hitherto, a power amplifier module including a driver-stage amplifier (power amplifier), an output-stage amplifier (power amplifier), an input switch, an output switch, an input matching circuit, an interstage matching circuit, an output matching circuit, and a control circuit (controller) is known (see Japanese Unexamined Patent Application Publication No. 2018-181943, for example). The power amplifier module is a radio-frequency module used in a mobile communication terminal, such as a cellular phone, to amplify power of an input signal to a level high enough to be transmitted to a base station.

The control circuit controls the operations of the input switch, the output switch, the driver-stage amplifier, and the output-stage amplifier.

Components forming the power amplifier module, such as the driver-stage amplifier, the output-stage amplifier, the input switch, the output switch, the input matching circuit, the interstage matching circuit, the output matching circuit, and the control circuit, are disposed on the mounting surface of a mounting substrate. The input switch, the output switch, and the control circuit are integrated into a single integrated circuit (IC) chip. The driver-stage amplifier and the output-stage amplifier are also integrated into a single IC chip.

SUMMARY

In a radio-frequency module, depending on the position of a controller disposed on a mounting substrate, a signal passing through the mounting substrate may interfere with a control signal. This may make the control operation of the controller for a power amplifier unstable.

It is an object of the present disclosure to provide a radio-frequency module and a communication device that are able to control a power amplifier more stably.

According to an aspect of the present disclosure, there is provided a radio-frequency module including a mounting substrate, a power amplifier, and a controller. The mounting substrate has first and second main surfaces opposing each other. The power amplifier is disposed on one of the first and second main surfaces of the mounting substrate. The controller is disposed on the other one of the first and second main surfaces of the mounting substrate. The controller controls the power amplifier.

According to another aspect of the present disclosure, there is provided a communication device including the radio-frequency module according to the above-described aspect and a signal processing circuit. The signal processing circuit is connected to the radio-frequency module.

The radio-frequency module and the communication device according to the above-described aspects are able to control a power amplifier more stably.

Other features, elements, characteristics and advantages of the present disclosure will become more apparent from the following detailed description of preferred embodiments of the present disclosure with reference to the attached drawings.

DETAILED DESCRIPTION

FIGS. 1 through 3, 5 through 12, 14 through 22, and 24 through 32B to be referred to in the following embodiments only schematically illustrate elements, and the ratios between the elements in terms of the size and the thickness do not necessarily reflect the actual dimensional ratios between the elements.

First Embodiment

A radio-frequency module 1 and a communication device 300 according to a first embodiment will be described below with reference to FIGS. 1 through 4.

Figure 4:
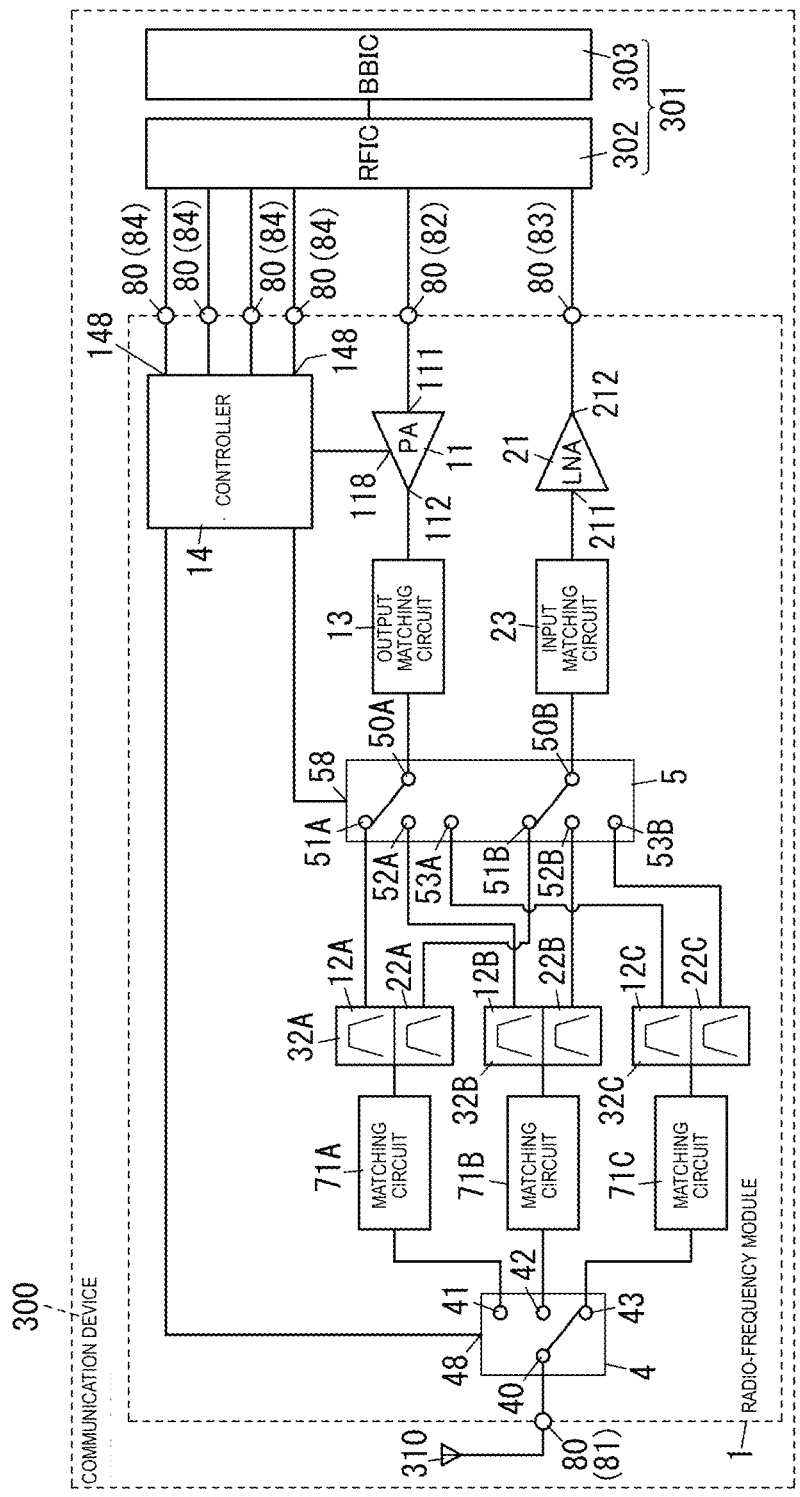
FIG. 4 is a circuit diagram of a communication device including the radio-frequency module of the first embodiment.

(1.1) Radio-Frequency Module and Communication Device (1.1.1) Circuit Configuration of Radio-Frequency Module and Communication Device The circuit configuration of the radio-frequency module 1 and the communication device 300 according to the first embodiment will be described below with reference to FIG. 4.

The radio-frequency module 1 of the first embodiment is used in the communication device 300, for example. The communication device 300 is a cellular phone, such as a smartphone, or may be another device, such as a wearable terminal (smartwatch, for example). The radio-frequency module 1 supports communication standards such as the fourth generation (4G) and the fifth generation (5G). 4G is Third Generation Partnership Project (3GPP) Long Term Evolution (LTE), for example. 5G is 5G New Radio (NR), for example. The radio-frequency module 1 also supports carrier aggregation and dual connectivity.

The radio-frequency module 1 can amplify a transmit signal received from a signal processing circuit 301 and output the amplified signal to an antenna 310 of the communication device 300. The radio-frequency module 1 can also amplify a received signal input from the antenna 310 and output the amplified signal to the signal processing circuit 301. The signal processing circuit 301 is not a component of the radio-frequency module 1 but is a component of the communication device 300 including the radio-frequency module 1. The radio-frequency module 1 is controlled by the signal processing circuit 301. The communication device 300 includes the radio-frequency module 1 and the signal processing circuit 301. The communication device 300 also includes the antenna 310 and a circuit substrate on which the radio-frequency module 1 is mounted. The circuit substrate is a printed wiring board, for example, and includes a ground electrode to which a ground potential is supplied.

The signal processing circuit 301 includes a radio-frequency (RF) signal processing circuit 302 and a baseband signal processing circuit 303. The RF signal processing circuit 302 is a radio-frequency integrated circuit (RFIC), for example, and performs signal processing on a radio-frequency signal. More specifically, the RF signal processing circuit 302 performs signal processing, such as up-conversion, on a radio-frequency signal (transmit signal) output from the baseband signal processing circuit 303 and outputs the transmit signal subjected to signal processing. The RF signal processing circuit 302 also performs signal processing, such as down-conversion, on a radio-frequency signal (received signal) output from the radio-frequency module 1 and outputs the received signal subjected to signal processing to the baseband signal processing circuit 303. The baseband signal processing circuit 303 is a baseband integrated circuit (BBIC), for example, and performs certain signal processing on a transmit signal received from the outside of the signal processing circuit 301. The baseband signal processing circuit 303 also performs certain signal processing on a received signal output from the RF signal processing circuit 302. The received signal processed by the baseband signal processing circuit 303 is used as an image signal for displaying an image or as an audio signal for communication. The radio-frequency module 1 transfers radio-frequency signals (transmit signals and received signals) between the antenna 310 and the RF signal processing circuit 302 of the signal processing circuit 301. In the communication device 300, the provision of the baseband signal processing circuit 303 may be omitted.

The radio-frequency module 1 includes a power amplifier 11 and a controller 14. The radio-frequency module 1 also includes a low-noise amplifier 21 and three duplexers 32A, 32B, and 32C. The duplexer 32A includes a transmit filter 12A and a receive filter 22A. The duplexer 32B includes a transmit filter 12B and a receive filter 22B. The duplexer 32C includes a transmit filter 12C and a receive filter 22C. The radio-frequency module 1 also includes a first switch 4, a second switch 5, an output matching circuit 13, an input matching circuit 23, and three matching circuits 71A, 71B, and 71C.

Figure 1:
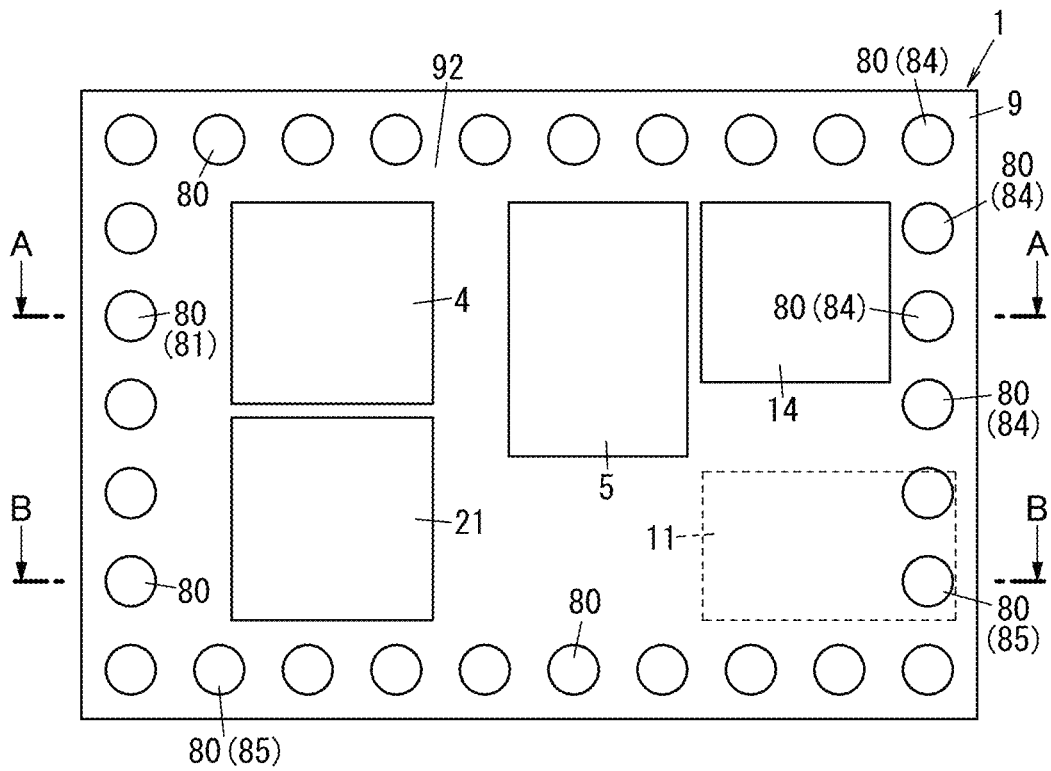
FIG. 1 is a bottom view of a radio-frequency module according to a first embodiment.
Figure 3:
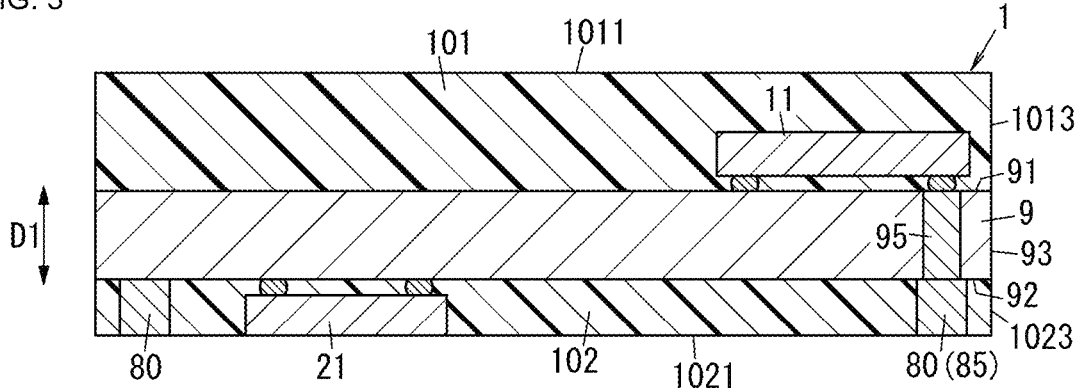
FIG. 3 is a sectional view of the radio-frequency module of the first embodiment taken along line B-B in FIG. 1.

The radio-frequency module 1 includes plural external connecting terminals 80, such as an antenna terminal 81, a signal input terminal 82, a signal output terminal 83, plural control terminals 84, and plural ground terminals 85 (see FIGS. 1 and 3). The plural ground terminals 85 are electrically connected to the ground electrode of the above-described circuit substrate of the communication device 300 and receive a ground potential.

The power amplifier 11 has an input terminal 111 and an output terminal 112. The power amplifier 11 amplifies a transmit signal of a predetermined frequency band input into the input terminal 111 and outputs the amplified transmit signal from the output terminal 112. The predetermined frequency band includes first, second, and third communication bands. The first communication band corresponds to a transmit signal passing through the transmit filter 12A and is 3GPP LTE Band 11, for example. The second communication band corresponds to a transmit signal passing through the transmit filter 12B and is 3GPP LTE Band 22, for example. The third communication band corresponds to a transmit signal passing through the transmit filter 12C and is 3GPP LTE Band 42 or 48 or 5G NR n77, for example. The input terminal 111 of the power amplifier 11 is connected to the signal input terminal 82. The input terminal 111 is connected to the signal processing circuit 301 via the signal input terminal 82. The signal input terminal 82 is a terminal via which a radio-frequency signal (transmit signal) from an external circuit, such as the signal processing circuit 301, is input into the radio-frequency module 1. The output terminal 112 of the power amplifier 11 is connected to a common terminal 50A of the second switch 5 via the output matching circuit 13. The power amplifier 11 is controlled by the controller 14.

The controller 14 is connected to the power amplifier 11. The controller 14 is connected to the signal processing circuit 301 via the plural (four, for example) control terminals 84. The plural control terminals 84 are terminals via which a control signal from an external circuit, such as the signal processing circuit 301, is input into the controller 14. The controller 14 controls the power amplifier 11, based on the control signal input via the plural control terminals 84. The plural control terminals 84 support a mobile industry processor interface (MIPI) standard, for example. As an input section for receiving a control signal, the controller 14 has plural terminals 148 corresponding to the plural control terminals 84. The plural terminals 148 support the MIPI standard, for example. In the radio-frequency module 1 of the first embodiment, the controller 14 is connected to an input section 118 of the power amplifier 11. The controller 14 controls the power amplifier 11 in accordance with a control signal from the RF signal processing circuit 302. The controller 14 receives the control signal from the RF signal processing circuit 302 by the plural terminals 148 and supplies a bias current to the power amplifier 11 based on the control signal. The controller 14 is also connected to an input section 48 of the first switch 4 and an input section 58 of the second switch 5, and controls the first and second switches 4 and 5 based on the control signal.

The low-noise amplifier 21 has an input terminal 211 and an output terminal 212. The low-noise amplifier 21 amplifies a received signal of the above-described predetermined frequency band input into the input terminal 211 and outputs the amplified received signal from the output terminal 212. The input terminal 211 of the low-noise amplifier 21 is connected to a common terminal 50B of the second switch 5 via the input matching circuit 23. The output terminal 212 of the low-noise amplifier 21 is connected to the signal output terminal 83. The output terminal 212 is connected to the signal processing circuit 301 via the signal output terminal 83, for example. The signal output terminal 83 is a terminal via which a radio-frequency signal (received signal) from the low-noise amplifier 21 is output to an external circuit, such as the signal processing circuit 301.

The transmit filter 12A is a filter which uses the transmit frequency band of the first communication band as the pass band. The transmit filter 12B is a filter which uses the transmit frequency band of the second communication band as the pass band. The transmit filter 12C is a filter which uses the transmit frequency band of the third communication band as the pass band. The receive filter 22A is a filter which uses the receive frequency band of the first communication band as the pass band. The receive filter 22B is a filter which uses the receive frequency band of the second communication band as the pass band. The receive filter 22C is a filter which uses the receive frequency band of the third communication band as the pass band.

The first switch 4 has a common terminal 40 and three selection terminals 41 through 43. The common terminal 40 is connected to the antenna terminal 81. The antenna 310 is connected to the antenna terminal 81. The selection terminal 41 is connected to a node between the output terminal of the transmit filter 12A and the input terminal of the receive filter 22A. The selection terminal 42 is connected to a node between the output terminal of the transmit filter 12B and the input terminal of the receive filter 22B. The selection terminal 43 is connected to a node between the output terminal of the transmit filter 12C and the input terminal of the receive filter 22C. The first switch 4 can connect at least one of the three selection terminals 41 through 43 to the common terminal 40. That is, the first switch 4 achieves one-to-one connection and one-to-many connection.

The first switch 4 is a switch IC, for example, and is controlled by the controller 14. For example, the first switch 4 changes the connection state between the common terminal 40 and the three selection terminals 41 through 43, based on a control signal from the controller 14.

The second switch 5 has two common terminals 50A and 50B, three selection terminals 51A, 52A, and 53A and three selection terminals 51B, 52B, and 53B. The common terminal 50A is connected to the output terminal 112 of the power amplifier 11 via the output matching circuit 13. The selection terminal 51A is connected to the input terminal of the transmit filter 12A (transmit terminal of the duplexer 32A). The selection terminal 52A is connected to the input terminal of the transmit filter 12B (transmit terminal of the duplexer 32B). The selection terminal 53A is connected to the input terminal of the transmit filter 12C (transmit terminal of the duplexer 32C). The common terminal 50B is connected to the input terminal 211 of the low-noise amplifier 21 via the input matching circuit 23. The selection terminal 51B is connected to the output terminal of the receive filter 22A (receive terminal of the duplexer 32A). The selection terminal 52B is connected to the output terminal of the receive filter 22B (receive terminal of the duplexer 32B). The selection terminal 53B is connected to the output terminal of the receive filter 22C (receive terminal of the duplexer 32C).

The second switch 5 can connect at least one of the three selection terminals 51A through 53A to the common terminal 50A. The second switch 5 can also connect at least one of the three selection terminals 51B through 53B to the common terminal 50B. That is, the second switch 5 achieves one-to-one connection and one-to-many connection for each of the two common terminals 50A and 50B.

The second switch 5 is a switch IC, for example, and is controlled by the controller 14. For example, the second switch 5 changes the connection state between the common terminal 50A and the three selection terminals 51A through 53A and between the common terminal 50B and the three selection terminals 51B through 53B, based on a control signal from the controller 14.

The output matching circuit 13 is disposed on a signal path between the output terminal 112 of the power amplifier 11 and the common terminal 50A of the second switch 5. The output matching circuit 13 provides impedance matching between the power amplifier 11 and the transmit filters 12A, 12B, and 12C. The output matching circuit 13 is constituted by one inductor 131 (see FIG. 2), for example, or may include plural inductors and plural capacitors.

The input matching circuit 23 is disposed on a signal path between the input terminal 211 of the low-noise amplifier 21 and the common terminal 50B of the second switch 5. The input matching circuit 23 provides impedance matching between the low-noise amplifier 21 and the receive filters 22A, 22B, and 22C. The input matching circuit 23 is constituted by one inductor, for example, or may include plural inductors and plural capacitors.

The matching circuit 71A provides impedance matching between the duplexer 32A and each of the antenna 310 connected to the antenna terminal 81 and the first switch 4.

The matching circuit 71A is disposed on a signal path between the selection terminal 41 of the first switch 4 and the antenna-side terminal of the duplexer 32A. The matching circuit 71A is constituted by one inductor, for example, or may include plural inductors and plural capacitors.

The matching circuit 71B provides impedance matching between the duplexer 32B and each of the antenna 310 connected to the antenna terminal 81 and the first switch 4. The matching circuit 71B is disposed on a signal path between the selection terminal 42 of the first switch 4 and the antenna-side terminal of the duplexer 32B. The matching circuit 71B is constituted by one inductor, for example, or may include plural inductors and plural capacitors.

The matching circuit 71C provides impedance matching between the duplexer 32C and each of the antenna 310 connected to the antenna terminal 81 and the first switch 4. The matching circuit 71C is disposed on a signal path between the selection terminal 43 of the first switch 4 and the antenna-side terminal of the duplexer 32C. The matching circuit 71C is constituted by one inductor, for example, or may include plural inductors and plural capacitors.

(1.1.2) Structure of Radio-Frequency Module

Figure 2:
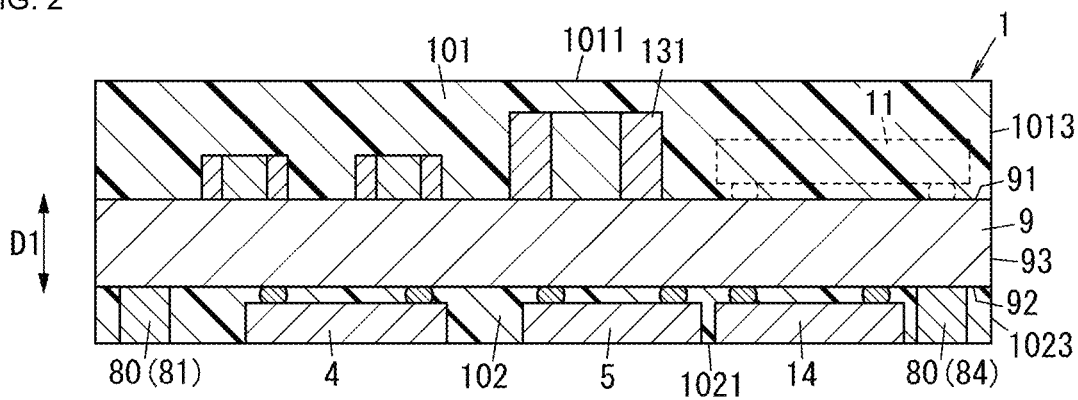
FIG. 2 is a sectional view of the radio-frequency module of the first embodiment taken along line A-A in FIG. 1.

The structure of the radio-frequency module 1 will be explained below with reference to FIGS. 1 through 3.

The radio-frequency module 1 includes a mounting substrate 9, plural circuit elements, and the multiple external connecting terminals 80.

The mounting substrate 9 has first and second main surfaces 91 and 92 opposing each other in a thickness direction D1 of the mounting substrate 9. Otherwise stated, the first and second main surfaces 91 and 92 are on opposite sides of the mounting substrate. The mounting substrate 9 is a printed wiring board or a low temperature co-fired ceramics (LTCC) substrate, for example. The mounting substrate 9 is a multilayer substrate including plural dielectric layers and plural conductive pattern layers that are stacked on each other in the thickness direction D1. The plural conductive pattern layers are each formed in a predetermined pattern, and each include one or multiple conductors in a plane perpendicular to the thickness direction D1. The plural conductive pattern layers are made of copper, for example, and include ground layers. In the radio-frequency module 1, the plural ground terminals 85 and the ground layers are electrically connected to each other using via-conductors, for example, included in the mounting substrate 9.

The first and second main surfaces 91 and 92 of the mounting substrate 9 are separated from each other in the thickness direction D1 and intersect with the thickness direction D1. The first main surface 91 is perpendicular to the thickness direction D1 but may include a surface which is not perpendicular to the thickness direction D1, such as a side surface of a conductor. The second main surface 92 is perpendicular to the thickness direction D1 but may include a surface which is not perpendicular to the thickness direction D1, such as a side surface of a conductor. On the first and second main surfaces 91 and 92, very small asperities (uneven portions), depressions, or projections may be formed.

As the plural circuit elements, the radio-frequency module 1 includes the above-described power amplifier 11, controller 14, low-noise amplifier 21, three duplexers 32A, 32B, and 32C, first switch 4, second switch 5, output matching circuit 13, input matching circuit 23, and three matching circuits 71A, 71B, and 71C. The circuit elements of the radio-frequency module 1 are mounted on the mounting substrate 9. "Being mounted on the mounting substrate 9" includes the meaning that the circuit elements are disposed on (mechanically connected to) the mounting substrate 9 and that the circuit elements are electrically connected to certain conductors in or on the mounting substrate 9. The plural circuit elements may include, not only electronic components mounted on the mounting substrate 9, but also circuit elements provided inside the mounting substrate 9. In FIG. 1, among the plural circuit elements, circuit elements other than the power amplifier 11, the controller 14, the low-noise amplifier 21, and the first and second switches 4 and 5 are not shown. In the radio-frequency module 1 of the first embodiment, the power amplifier 11 is disposed on the first main surface 91 of the mounting substrate 9, while the controller 14, the low-noise amplifier 21, and the first and second switches 4 and 5 are disposed on the second main surface 92 of the mounting substrate 9. The first switch 4 is provided for both of signal paths for transmit signals and those for received signals. This will be explained more specifically. The first switch 4 is provided for the signal path for transmit signals on which the power amplifier 11, the output matching circuit 13, the second switch 5, and the transmit filter 12A are disposed. The first switch 4 is provided also for the signal path for transmit signals on which the power amplifier 11, the output matching circuit 13, the second switch 5, and the transmit filter 12B are disposed. The first switch 4 is provided also for the signal path for transmit signals on which the power amplifier 11, the output matching circuit 13, the second switch 5, and the transmit filter 12C are disposed. The first switch 4 is provided also for the signal path for received signals on which the receive filter 22A, the second switch 5, the input matching circuit 23, and the low-noise amplifier 21 are disposed. The first switch 4 is provided also for the signal path for received signals on which the receive filter 22B, the second switch 5, the input matching circuit 23, and the low-noise amplifier 21 are disposed. The first switch 4 is provided also for the signal path for received signals on which the receive filter 22C, the second switch 5, the input matching circuit 23, and the low-noise amplifier 21 are disposed.

In the radio-frequency module 1, the power amplifier 11 is an IC chip including a substrate having first and second main surfaces opposing each other and an IC having at least one transistor formed on the first main surface of the substrate. The substrate is a gallium arsenide (GaAs) substrate, for example. The IC has a function of amplifying a transmit signal input into the input terminal 111 of the power amplifier 11. The transistor of the IC is a heterojunction bipolar transistor (HBT), for example. The power amplifier 11 may include a direct current (DC)-cut capacitor. The IC chip forming the power amplifier 11 is flip-chip mounted on the first main surface 91 of the mounting substrate 9 so that the first main surface of the substrate of the power amplifier 11 faces the first main surface 91 of the mounting substrate 9. The outer shape of the power amplifier 11 is substantially quadrilateral, as viewed in the thickness direction D1 of the mounting substrate 9.

In the radio-frequency module 1, the controller 14 is an IC chip including a substrate having first and second main surfaces opposing each other and an IC formed on the first main surface of the substrate. The substrate is a silicon substrate, for example. The IC has a function of controlling the power amplifier 11. The IC also has a function of controlling the first switch 4 and a function of controlling the second switch 5. The IC chip forming the controller 14 is flip-chip mounted on the second main surface 92 of the mounting substrate 9 so that the first main surface of the substrate of the controller 14 faces the second main surface 92 of the mounting substrate 9. The outer shape of the controller 14 is substantially quadrilateral, as viewed in the thickness direction D1 of the mounting substrate 9.

The low-noise amplifier 21 is a single IC chip including a substrate having first and second main surfaces opposing each other and an IC formed on the first main surface of the substrate. The substrate is a silicon substrate, for example. The IC has a function of amplifying a received signal input into the input terminal 211 of the low-noise amplifier 21. The low-noise amplifier 21 is flip-chip mounted on the second main surface 92 of the mounting substrate 9 so that the first main surface of the substrate of the low-noise amplifier 21 faces the second main surface 92 of the mounting substrate 9. The outer shape of the low-noise amplifier 21 is substantially quadrilateral, as viewed in the thickness direction D1 of the mounting substrate 9.

The three duplexers 32A, 32B, and 32C are bare-chip duplexers, for example. As discussed above, the duplexer 32A includes the transmit filter 12A and the receive filter 22A; the duplexer 32B includes the transmit filter 12B and the receive filter 22B; and the duplexer 32C includes the transmit filter 12C and the receive filter 22C.

Each of the three transmit filters 12A, 12B, and 12C and each of the three receive filters 22A, 22B, and 22C is a ladder filter and includes plural (four, for example) series arm resonators and plural (three, for example) parallel arm resonators. Each of the three transmit filters 12A, 12B, and 12C and each of the three receive filters 22A, 22B, and 22C is an acoustic wave filter, for example, and the plural series arm resonators and the plural parallel arm resonators are each constituted by an acoustic wave resonator. An example of the acoustic wave filter is a surface acoustic wave (SAW) filter using SAWs.

Each of the plural series arm resonators and the plural parallel arm resonators forming a SAW filter is a SAW resonator.

Each of the three duplexers 32A, 32B, and 32C includes a substrate having first and second main surfaces, a first circuit serving as a transmit filter (the corresponding one of the transmit filters 12A, 12B, and 12C) formed on the first main surface of the substrate, and a second circuit serving as a receive filter (the corresponding one of the receive filters 22A, 22B, and 22C) formed on the first main surface of the substrate. The substrate may be a piezoelectric substrate, such as a lithium tantalate substrate or a lithium niobate substrate. Each of the first and second circuits has multiple interdigital transducer (IDT) electrodes associated with the series arm resonators based on a one-on-one correspondence and multiple IDT electrodes associated with the parallel arm resonators based on a one-on-one correspondence.

The three duplexers 32A, 32B, and 32C are mounted on the first main surface 91 of the mounting substrate 9. The three duplexers 32A, 32B, and 32C are disposed so that the first main surfaces of the substrates thereof face the mounting substrate 9. The outer shape of each of the three duplexers 32A, 32B, and 32C is substantially quadrilateral, as viewed in the thickness direction D1 of the mounting substrate 9.

In each of the three duplexers 32A, 32B, and 32C, the substrate is not limited to a piezoelectric substrate and may be a silicon substrate, for example. If a silicon substrate is used, each of the three duplexers 32A, 32B, and 32C includes a low acoustic velocity film formed on the first main surface of the substrate and a piezoelectric layer formed on the low acoustic velocity film. The multiple IDT electrodes are disposed on the piezoelectric layer. The low acoustic velocity film is disposed directly or indirectly on the substrate. The piezoelectric layer is disposed directly or indirectly on the low acoustic velocity film. The acoustic velocity of bulk waves propagating through the low acoustic velocity film is lower than that of bulk waves through the piezoelectric layer. The material for the piezoelectric layer is lithium tantalate, for example. The material for the low acoustic velocity film is silicon oxide, for example. The thickness of the piezoelectric layer is 3.5λ or smaller, for example, and the thickness of the low acoustic velocity film is 2.0λ or smaller, for example, where X is the wavelength of acoustic waves determined by the period of electrode fingers of the IDT electrodes.

The piezoelectric layer may be made of any of lithium tantalate, lithium niobate, zinc oxide, aluminum nitride, and lead zirconate titanate (PZT). The low acoustic velocity film contains at least one material selected from the group consisting of silicon oxide, glass, silicon oxynitride, tantalum oxide, and a compound obtained by adding fluorine, carbon, or boron to silicon oxide. The substrate contains at least one material selected from the group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond.

Each of the three duplexers 32A, 32B, and 32C may include a contact layer intervening between the low acoustic velocity film and the piezoelectric layer. The contact layer may be made of a resin, such as an epoxy resin or a polyimide resin. Each of the three duplexers 32A, 32B, and 32C may include a dielectric film between the low acoustic velocity film and the piezoelectric layer, or on the piezoelectric layer, or under the low acoustic velocity film.

Each of the three duplexers 32A, 32B, and 32C may include a high acoustic velocity film intervening between the substrate and the low acoustic velocity film. The high acoustic velocity film is disposed directly or indirectly on the substrate. The low acoustic velocity film is disposed directly or indirectly on the high acoustic velocity film. The piezoelectric layer is disposed directly or indirectly on the low acoustic velocity film. The acoustic velocity of bulk waves propagating through the high acoustic velocity film is higher than that of acoustic waves through the piezoelectric layer. The acoustic velocity of bulk waves propagating through the low acoustic velocity film is lower than that of bulk waves through the piezoelectric layer.

As the high acoustic velocity film, various piezoelectric materials, such as diamond-like carbon, aluminum nitride, aluminum oxide, silicon carbide, silicon nitride, silicon, sapphire, lithium tantalate, lithium niobate, and quartz; various ceramic materials, such as alumina, zirconia, cordierite, mullite, steatite, and forsterite; magnesia; and diamond may be used. Alternatively, a medium made of any of the above-described materials as a main constituent, or a medium made of a mixture of any of the above-described materials as a main constituent may be used.

Regarding the thickness of the high acoustic velocity film, a thicker film is more desirable because the high acoustic velocity film has a function of trapping acoustic waves within the piezoelectric layer and the low acoustic velocity film.

Each of the three duplexers 32A, 32B, and 32C may also include a spacer layer and a cover member. The spacer layer and the cover member are provided on the first main surface of the substrate. The spacer layer has a frame-like rectangular shape and surrounds the multiple IDT electrodes, as viewed in the thickness direction D1 of the mounting substrate 9. The spacer layer has electrical insulation properties and is made of a synthetic resin, such as an epoxy resin or a polyimide. The cover member has a planar shape. As viewed from the thickness direction D1 of the mounting substrate 9, the cover member is substantially rectangular or substantially square. In each of the three duplexers 32A, 32B, and 32C, the external dimensions of the cover member and those of the spacer layer are substantially the same, as viewed from the thickness direction D1 of the mounting substrate 9. The cover member is located on the spacer layer so as to oppose the substrate in the thickness direction D1 of the mounting substrate 9. The cover member overlaps the IDT electrodes and are also separated from the IDT electrodes in the thickness direction D1 of the mounting substrate 9. The cover member has electrical insulation properties and is made of a synthetic resin, such as an epoxy resin or a polyimide. Each of the three duplexers 32A, 32B, and 32C has a space surrounded by the substrate, the spacer layer, and the cover member. A gas, such as air or an inert gas (nitrogen gas, for example), fills the space. The plural terminals of each of the three duplexers 32A, 32B, and 32C are exposed on the cover member to the exterior. Each of the plural terminals is a bump, such as a solder bump. Each bump may alternatively be a gold bump.

Each of the first and second switches 4 and 5 is a switch IC. More specifically, each of the first and second switches 4 and 5 is a single IC chip including a substrate having first and second main surfaces opposing each other and an IC having a field effect transistor (FET) formed on the first main surface of the substrate. The substrate is a silicon substrate, for example. The IC is a function element serving to switch the connection state. Each of the first and second switches 4 and 5 is flip-chip mounted on the second main surface 92 of the mounting substrate 9 so that the first main surface of the substrate of each of the first and second switches 4 and 5 faces the second main surface 92 of the mounting substrate 9. The outer shape of the IC chip forming each of the first and second switches 4 and 5 is substantially quadrilateral, as viewed in the thickness direction D1 of the mounting substrate 9.

The inductor 131 (see FIG. 2) of the output matching circuit 13 is a chip inductor, for example. The inductor 131 is mounted on the first main surface 91 of the mounting substrate 9, but this is only an example. The outer shape of the inductor 131 is substantially quadrilateral, as viewed in the thickness direction D1 of the mounting substrate 9.

An inductor of the input matching circuit 23 is a chip inductor, for example. The inductor of the input matching circuit 23 is mounted on the first main surface 91 of the mounting substrate 9, but this is only an example. The outer shape of the inductor is substantially quadrilateral, as viewed in the thickness direction D1 of the mounting substrate 9.

An inductor of each of the three matching circuits 71A, 71B, and 71C is a chip inductor, for example. The inductor of each of the three matching circuits 71A, 71B, and 71C is mounted on the first main surface 91 of the mounting substrate 9, but this is only an example. The outer shape of the inductor is substantially quadrilateral, as viewed in the thickness direction D1 of the mounting substrate 9.

The multiple external connecting terminals 80 are disposed on the second main surface 92 of the mounting substrate 9. The material for the external connecting terminals 80 is a metal, such as copper or a copper alloy. Each of the external connecting terminals 80 is a columnar electrode, such as a cylindrical electrode.

As discussed above, the multiple external connecting terminals 80 include the antenna terminal 81, the signal input terminal 82, the signal output terminal 83, the plural control terminals 84, and the plural ground terminals 85. The ground terminals 85 are electrically connected to the ground layers of the mounting substrate 9, as stated above. The ground layers are circuit grounds of the radio-frequency module 1, and some of the multiple circuit elements of the radio-frequency module 1 are electrically connected to the ground layers. The multiple external connecting terminals 80 include a power supply terminal for supplying a voltage from an external source to some circuit elements, such as the power amplifier 11.

The radio-frequency module 1 also includes a first resin layer 101 disposed on the first main surface 91 of the mounting substrate 9 so as to cover plural circuit elements (power amplifier 11, three duplexers 32A, 32B, and 32C, inductor 131 of the output matching circuit 13, inductor of the input matching circuit 23, and inductors of the matching circuits 71A, 71B, and 71C) mounted on the first main surface 91 of the mounting substrate 9. The first resin layer 101 contains a resin and may also contain a filler.

The radio-frequency module 1 also includes a second resin layer 102 disposed on the second main surface 92 of the mounting substrate 9 so as to cover part of each of plural circuit elements (controller 14, low-noise amplifier 21, and first and second switches 4 and 5) mounted on the second main surface 92 of the mounting substrate 9. The second resin layer 102 is formed to expose the second main surfaces of the substrates of the controller 14, the low-noise amplifier 21, and the first and second switches 4 and 5. The second resin layer 102 contains a resin and may also contain a filler. The material for the second resin layer 102 and that of the first resin layer 101 may be the same or different from each other.

The radio-frequency module 1 also includes a shield layer. The material for the shield layer is a metal, for example. The shield layer covers a main surface 1011 and an outer peripheral surface 1013 of the first resin layer 101, an outer peripheral surface 93 of the mounting substrate 9, and an outer peripheral surface 1023 of the second resin layer 102. The shield layer contacts the ground layers of the mounting substrate 9. This can make the shield layer at the same potential as the ground layers.

(1.2) Manufacturing Method for Radio-Frequency Module

An example of the manufacturing method for the radio-frequency module 1 is as follows. In a first step, plural circuit elements are mounted on the mounting substrate 9. In the first step, multiple conductive pillars which form the multiple external connecting terminals 80 are also disposed on the second main surface 92 of the mounting substrate 9.

After the first step, a second step is performed. In the second step, the first resin layer 101 is formed to cover the plural circuit elements disposed on the first main surface 91 of the mounting substrate 9. In the second step, a resin layer which serves as the second resin layer 102 is also formed to cover the plural circuit elements and the multiple conductive pillars disposed on the second main surface 92 of the mounting substrate 9.

After the second step, a third step is performed. In the third step, grinding is performed for the resin layer formed in the second step. More specifically, the surface opposite that facing the mounting substrate 9 of the resin layer is ground to form the second resin layer 102. In the third step, even after the resin layer is ground to such a degree to expose the second main surface of the substrate of at least one of the circuit elements, it is further ground to make the substrates of the plural circuit elements thinner. In the third step, as a result of grinding the conductive pillars, the multiple external connecting terminals 80 are formed.

After the third step, a fourth step is performed. In the fourth step, the shield layer is formed. In the first through third steps, instead of using an individual mounting substrate 9, a collective board may be used. In this case, the collective board is divided into individual mounting substrates 9 at the end of the third step, and then, the fourth step is performed.

(1.3) Conclusions

(1.3.1) Radio-Frequency Module

The radio-frequency module 1 according to the first embodiment includes the mounting substrate 9, the power amplifier 11, and the controller 14. The mounting substrate 9 has the first and second main surfaces 91 and 92 opposing each other. The power amplifier 11 is disposed on one of the first and second main surfaces 91 and 92 (the first main surface 91, in this example) of the mounting substrate 9. The controller 14 is disposed on the other one of the first and second main surfaces 91 and 92 (the second main surface 92, in this example) of the mounting substrate 9. The controller 14 controls the power amplifier 11.

The radio-frequency module 1 is able to control the power amplifier 11 more stably.

The radio-frequency module 1 also includes the multiple external connecting terminals 80 disposed on the second main surface 92 of the mounting substrate 9. The power amplifier 11 is disposed on the first main surface 91 of the mounting substrate 9. The controller 14 is disposed on the second main surface 92 of the mounting substrate 9.

The radio-frequency module 1 can easily dissipate heat generated in the power amplifier 11.

In the radio-frequency module 1, the multiple external connecting terminals 80 include a control terminal 84. The controller 14 controls the power amplifier 11 based on a control signal received via the control terminal 84.

The radio-frequency module 1 is able to control the power amplifier 11 more stably. In the radio-frequency module 1, the controller 14 is disposed on the second main surface 92 of the mounting substrate 9. This makes it less likely to cause the degradation of the adjacent channel leakage ratio (ACLR) and a transmit signal, which would be caused by unwanted radiation of a control signal (digital signal of several to several dozens of megahertz) sent from an external circuit, such as the signal processing circuit 301.

Unlike the radio-frequency module 1 of the first embodiment, in a radio-frequency module of a certain comparative example, a controller is disposed on a first main surface of a mounting substrate, and plural external connecting terminals including control terminals are disposed on a second main surface of the mounting substrate. In such a radio-frequency module, a control signal passes through the mounting substrate to be output to the controller from the control terminals. In this case, another signal passing through the mounting substrate interferes with the control signal, which may make the control operation of the controller for a power amplifier unstable. In contrast, in the radio-frequency module 1 of the first embodiment, both of the controller 14 and the control terminals 84 are disposed on the second main surface 92 of the mounting substrate 9, as discussed above. With this arrangement, among the plural conductive pattern layers, the conductor included in the conductive pattern layer positioned most closely to the second main surface 92 in the thickness direction D1 of the mounting substrate 9 can be used to form wiring which connects the control terminals 84 and the controller 14. This makes the control signal less vulnerable to the interference of other signals (such as a transmit signal) than the configuration in which wiring connecting the control terminals 84 and the controller 14 is formed along the thickness direction D1 of the mounting substrate 9. This enhances the isolation between the control signal and other signals. As a result, the radio-frequency module 1 of the first embodiment can control the power amplifier 11 more stably.

In the radio-frequency module 1, the controller 14 is mounted on the second main surface 92 of the mounting substrate 9. This increases the flexibility of the layout of circuit elements to be mounted on the first main surface 91 of the mounting substrate 9, compared with the configuration in which the controller 14 is mounted on the first main surface 91 of the mounting substrate 9. The size of the radio-frequency module 1 can also be reduced.

In the radio-frequency module 1, the multiple external connecting terminals 80 include the plural control terminals 84 that support the MIPI standard. The controller 14 also supports the MIPI standard and has the plural terminals 148 connected to the control terminals 84. A control signal based on the MIPI standard is thus less vulnerable to the interference of other signals.

In the radio-frequency module 1, the power amplifier 11 is flip-chip mounted on the first main surface 91 of the mounting substrate 9. The mounting substrate 9 also includes a via-electrode 95. The via-electrode 95 is formed along the thickness direction D1 of the mounting substrate 9 and is connected to the power amplifier 11. This makes it easier to dissipate heat generated in the power amplifier 11.

In the radio-frequency module 1, a footprint of the power amplifier 11 and a footprint of the controller 14 do not overlap, as viewed in the thickness direction D1 of the mounting substrate 9. This further enhances the isolation between the power amplifier 11 and the controller 14 and accordingly enhances the isolation between a transmit signal and a control signal.

The radio-frequency module 1 also includes the low-noise amplifier 21. The low-noise amplifier 21 is mounted on the second main surface 92 of the mounting substrate 9 and is disposed on a signal path for received signals. The footprint of the power amplifier 11 and a footprint of the low-noise amplifier 21 do not overlap each other, as viewed in the thickness direction D1 of the mounting substrate 9. This enhances the isolation between the power amplifier 11 and the low-noise amplifier 21.

(1.3.2) Communication Device

The communication device 300 according to the first embodiment includes the radio-frequency module 1 and the signal processing circuit 301. The signal processing circuit 301 is connected to the radio-frequency module 1 and processes a transmit signal to be sent to the antenna 310. The radio-frequency module 1 transfers a transmit signal between the antenna 310 and the signal processing circuit 301.

The communication device 300 of the first embodiment includes the radio-frequency module 1 and can thus control the power amplifier 11 more stably. Plural electronic components forming the signal processing circuit 301 may be mounted on the above-described circuit substrate (first circuit substrate) on which the radio-frequency module 1 is mounted or on another circuit substrate (second circuit substrate).

Figure 5:
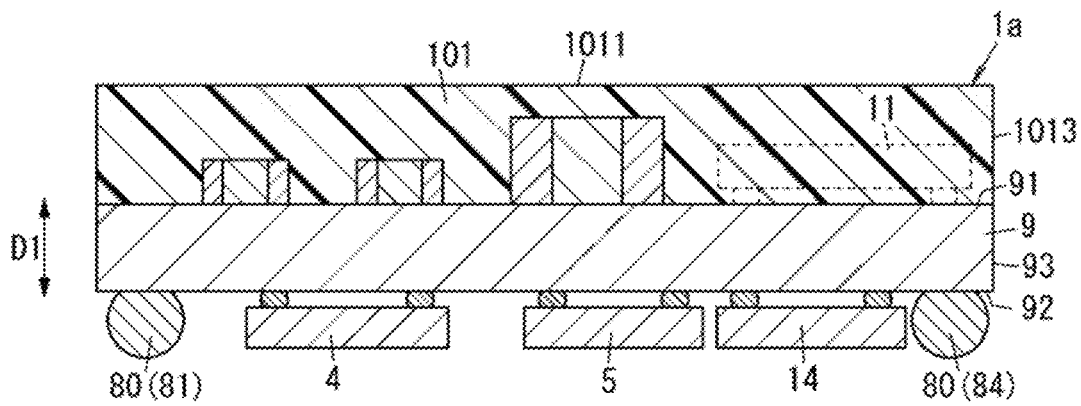
FIG. 5 is a sectional view of a radio-frequency module according to a first modified example of the first embodiment.

(1.4) Modified Examples of Radio-Frequency Module (1.4.1) First Modified Example A radio-frequency module 1a according to a first modified example of the first embodiment will be described below with reference to FIG. 5. Elements of the radio-frequency module 1a of the first modified example similar to those of the radio-frequency module 1 of the first embodiment are designated by like reference numerals, and an explanation thereof will be omitted.

The radio-frequency module 1a is different from the radio-frequency module 1 in that the plural external connecting terminals 80 are ball bumps and the second resin layer 102 is not provided. The radio-frequency module 1a may include an underfill in a gap between the second main surface 92 of the mounting substrate 9 and each of the first and second switches 4 and 5 and the controller 14.

The material for the ball bumps forming the plural external connecting terminals 80 is gold, copper, or a solder, for example.

As the external connecting terminals 80, both of external connecting terminals 80 constituted by ball bumps and those constituted by columnar electrodes may be provided.

(1.4.2) Second Modified Example

Figure 6:
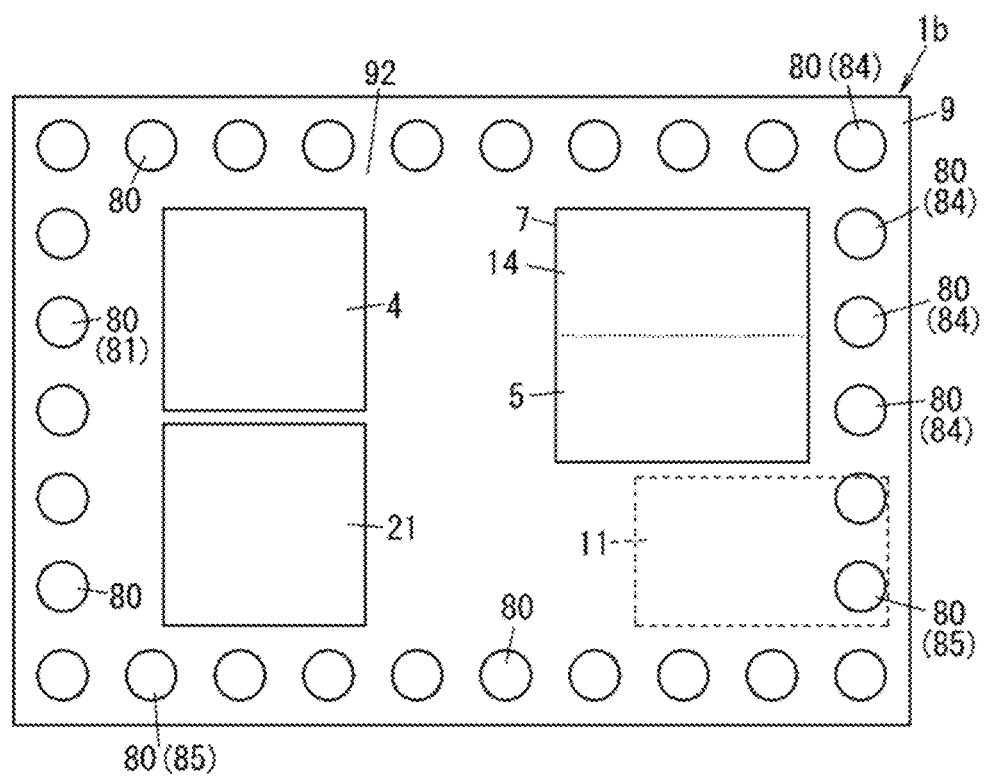
FIG. 6 is a bottom view of a radio-frequency module according to a second modified example of the first embodiment.

A radio-frequency module 1b according to a second modified example of the first embodiment will be described below with reference to FIG. 6. Elements of the radio-frequency module 1b of the second modified example similar to those of the radio-frequency module 1 of the first embodiment are designated by like reference numerals, and an explanation thereof will be omitted.

The radio-frequency module 1b is different from the radio-frequency module 1 in that the second switch 5 and the controller 14 are formed into one chip. The radio-frequency module 1b includes an IC chip 7 integrating the controller 14 and the second switch 5 and can thus reduce the number of components (IC chips). This can increase the flexibility of the layout of the circuit elements to be mounted on the second main surface 92 of the mounting substrate 9. In the radio-frequency module 1b, more ground terminals 85 can be disposed on the second main surface 92 of the mounting substrate 9.

(1.4.3) Third Modified Example

Figure 7:
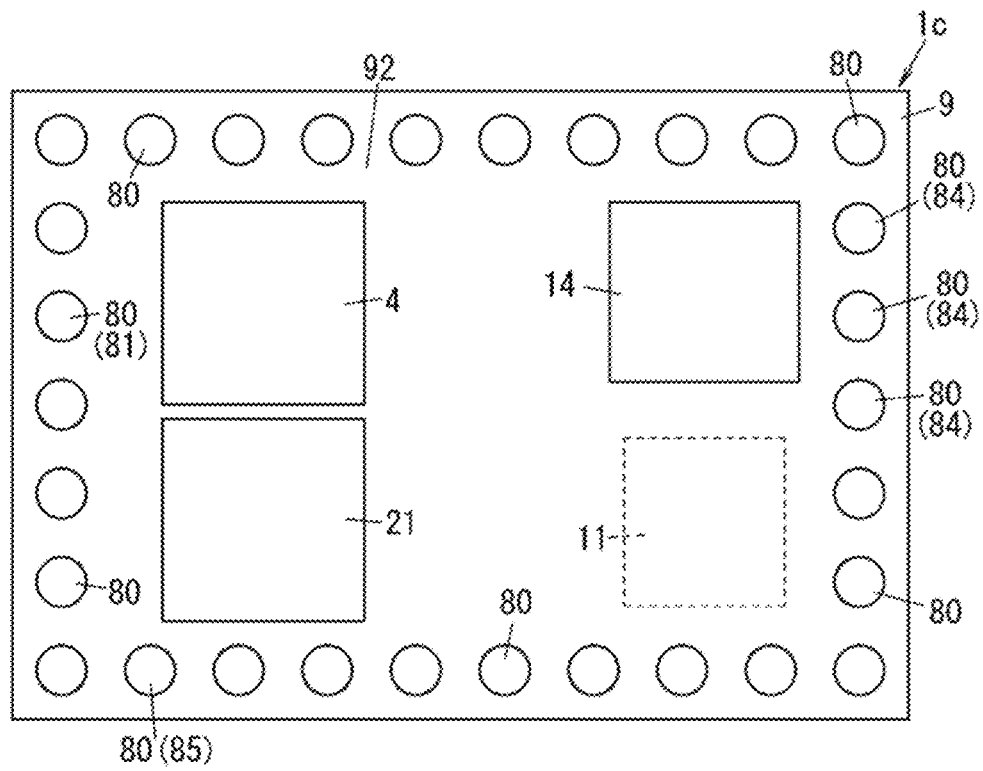
FIG. 7 is a bottom view of a radio-frequency module according to a third modified example of the first embodiment.

A radio-frequency module 1c according to a third modified example of the first embodiment will be described below with reference to FIG. 7. Elements of the radio-frequency module 1c of the third modified example similar to those of the radio-frequency module 1 of the first embodiment are designated by like reference numerals, and an explanation thereof will be omitted.

The radio-frequency module 1c is different from the radio-frequency module 1 in that the second switch 5 (see FIG. 1) is mounted on the first main surface 91 of the mounting substrate 9 instead of on the second main surface 92.

(1.4.4.) Fourth Modified Example

Figure 8:
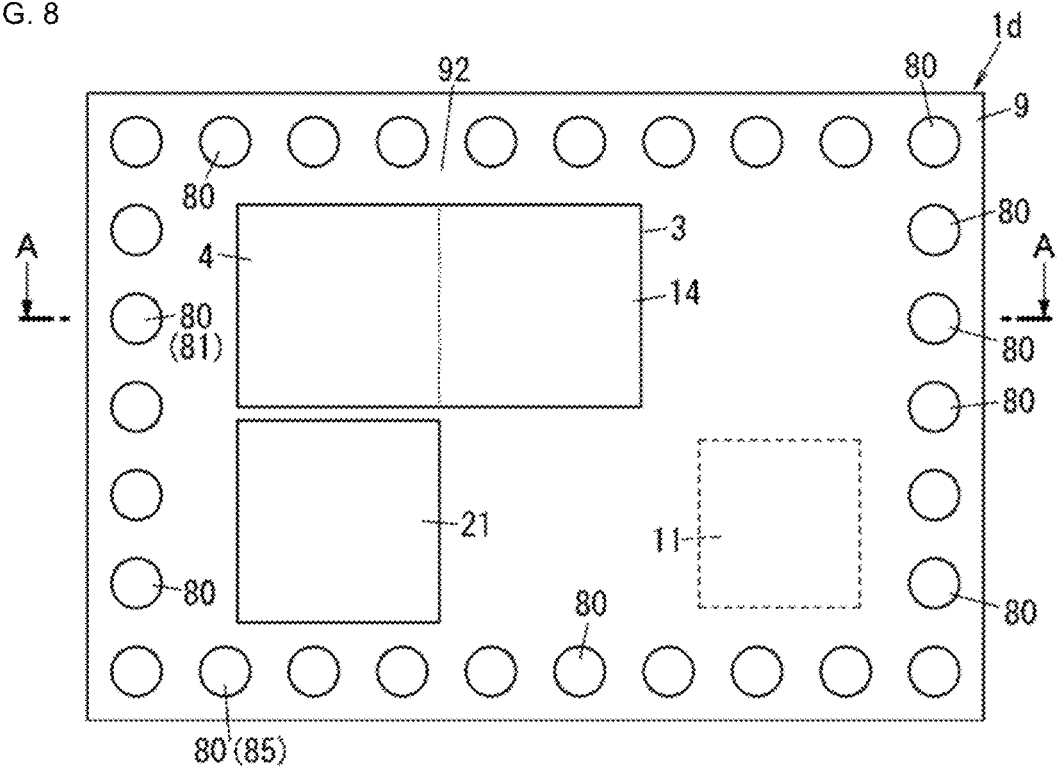
FIG. 8 is a bottom view of a radio-frequency module according to a fourth modified example of the first embodiment.
Figure 9:
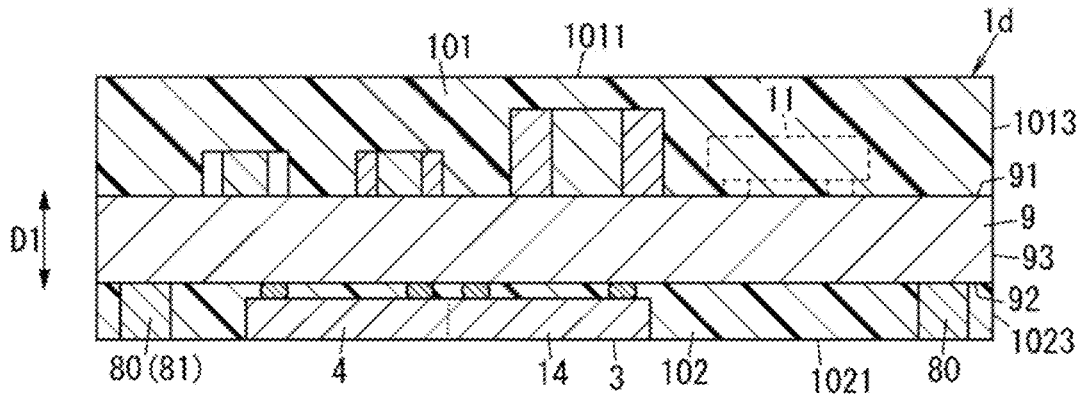
FIG. 9 is a sectional view of the radio-frequency module of the fourth modified example of the first embodiment taken along line A-A in FIG. 8.

A radio-frequency module 1d according to a fourth modified example of the first embodiment will be described below with reference to FIGS. 8 and 9. Elements of the radio-frequency module 1*d* of the fourth modified example similar to those of the radio-frequency module 1 of the first embodiment are designated by like reference numerals, and an explanation thereof will be omitted.

The radio-frequency module 1*d* is different from the radio-frequency module 1 in that the first switch 4 and the controller 14 are formed into one chip. The radio-frequency module 1*d* includes an IC chip 3 integrating the controller 14 and the first switch 4 and can thus reduce the number of components (IC chips). This can increase the flexibility of the layout of the circuit elements to be mounted on the second main surface 92 of the mounting substrate 9. In the radio-frequency module 1*d*, more ground terminals 85 can be disposed on the second main surface 92 of the mounting substrate 9.

The radio-frequency module 1*d* is also different from the radio-frequency module 1 in that the second switch 5 (see FIG. 1) is mounted on the first main surface 91 of the mounting substrate 9 instead of on the second main surface 92. This can further increase the flexibility of the layout of the circuit elements to be mounted on the second main surface 92 of the mounting substrate 9.

(1.4.5) Fifth Modified Example

Figure 10:
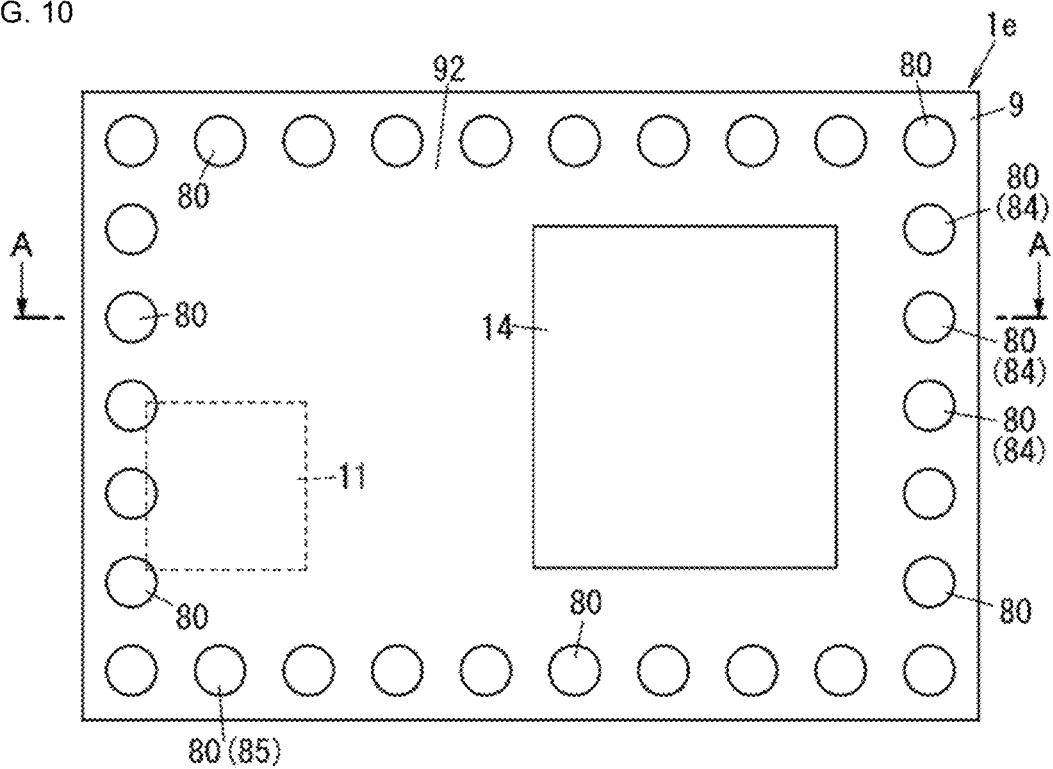
FIG. 10 is a bottom view of a radio-frequency module according to a fifth modified example of the first embodiment.
Figure 11:
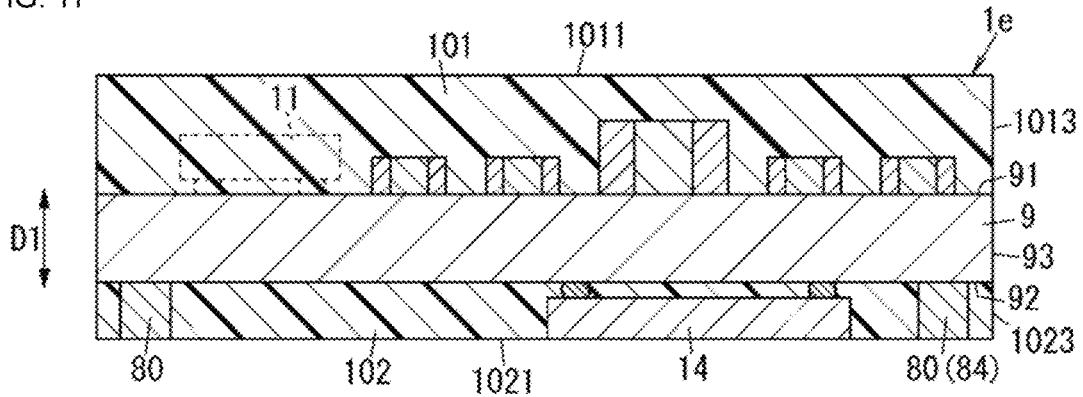
FIG. 11 is a sectional view of the radio-frequency module of the fifth modified example of the first embodiment taken along line A-A in FIG. 10.

A radio-frequency module 1*e* according to a fifth modified example of the first embodiment will be described below with reference to FIGS. 10 and 11. Elements of the radio-frequency module 1*e* of the fifth modified example similar to those of the radio-frequency module 1 of the first embodiment are designated by like reference numerals, and an explanation thereof will be omitted.

The radio-frequency module 1*e* is different from the radio-frequency module 1 in that the first and second switches 4 and 5 (see FIG. 1) and the low-noise amplifier 21 (see FIG. 1) are mounted on the first main surface 91 of the mounting substrate 9 instead of on the second main surface 92. This can further increase the flexibility of the layout of the circuit elements to be mounted on the second main surface 92 of the mounting substrate 9.

(1.5) Other Modified Examples

The above-described first embodiment and modified examples are only examples of the disclosure. Various changes may be made to the first embodiment and modified examples in accordance with certain factors, such as the design, as long as the object of the disclosure is achievable.

For example, the mounting substrate 9 is not limited to a printed wiring board or an LTCC substrate, and may be another type of substrate, such as a high temperature co-fired ceramics (HTCC) substrate or a component-embedded substrate.

The mounting substrate 9 may be a wiring structure. The wiring structure is a multilayer structure, for example. The multilayer structure includes at least one insulating layer and at least one conductive layer. The insulating layer is formed in a predetermined pattern. If plural insulating layers are provided, each insulating layer is formed in a predetermined pattern. The conductive layer is formed in a predetermined pattern different from the pattern of the insulating layer. If plural conductive layers are provided, each conductive layer is formed in a predetermined pattern. The conductive layer may include one or plural rewiring sections. The wiring structure has first and second surfaces opposing each other in its thickness direction. The first surface corresponds to the first main surface 91 of the mounting substrate 9, while the second surface corresponds to the second main surface 92 of the mounting substrate 9. The wiring structure may be an interposer, such as an interposer using a silicon substrate or a multilayer substrate.

Although the power amplifier 11 is disposed on the first main surface 91 of the mounting substrate 9 in the above-described first embodiment and modified examples, it may alternatively be disposed on the second main surface 92 of the mounting substrate 9. The power amplifier 11 may not necessarily be flip-chip mounted on the first main surface 91, and may alternatively be mounted using bonding wires. More specifically, the power amplifier 11 may be bonded to the first main surface 91 of the mounting substrate 9 using a die bonding material so that the second main surface of the substrate of the power amplifier 11 faces the first main surface 91, and terminals (pad electrodes) on the first main surface of the substrate of the power amplifier 11 may be electrically connected to the conductors of the conductive pattern layer near the first main surface 91 of the mounting substrate 9 via bonding wires.

In the radio-frequency module 1 of the first embodiment, the second main surfaces of the substrates of multiple circuit elements, such as the controller 14, the low-noise amplifier 21, and the first and second switches 4 and 5, mounted on the second main surface 92 of the mounting substrate 9 may be covered by the second resin layer 102.

The number of selection terminals of each of the first and second switches 4 and 5 is not limited to the above-described number, and any plural number of selection terminals may be provided.

In the radio-frequency module 1 of the first embodiment, instead of the second switch 5, a switch IC including the common terminal 50A and the selection terminals 51A through 53A and a switch IC including the common terminal 50B and the selection terminals 51B through 53B may be used.

In the radio-frequency module 1 of the first embodiment, the first and second switches 4 and 5 and the controller 14 may be formed into a single IC chip. That is, the radio-frequency module 1 may include an IC chip integrating the first and second switches 4 and 5 and the controller 14.

Instead of being controlled by the controller 14, the first and second switches 4 and 5 may be controlled by a control signal from the RF signal processing circuit 302 of the signal processing circuit 301, for example.

The substrate of the power amplifier 11 is not limited to a GaAs substrate and may be a silicon substrate. In this case, the transistor of the power amplifier 11 is a bipolar transistor or a metal-oxide-semiconductor field effect transistor (MOSFET) instead of an HBT.

Each of the transmit filters 12A, 12B, and 12C and the receive filters 22A, 22B, and 22C is not limited to a ladder filter, and may be another type of filter, such as a longitudinally coupled resonator SAW filter.

The above-described filter is an acoustic wave filter using SAWs, but may be an acoustic wave filter using boundary acoustic waves or lamb waves.

Each of the plural series arm resonators and plural parallel arm resonators forming the acoustic wave filter is not restricted to a SAW resonator, and may be another type of resonator, such as a bulk acoustic wave (BAW) resonator.

The filter may be an LC filter. However, the attenuation characteristics of an acoustic wave filter in and near the pass band are higher than those of an LC filter, and the reflection coefficient ($\Gamma$) of an acoustic wave filter in the mid-band is greater than that of an LC filter.

The output matching circuit 13 may be a single IC chip including a substrate having first and second main surfaces opposing each other and an IC having plural inductors and plural capacitors formed on the first main surface of this substrate. In this case, the IC chip may be an integrated passive device (IPD). The substrate is a silicon substrate, for example. If the output matching circuit 13 is an IPD, it is flip-chip mounted on the first main surface 91 of the mounting substrate 9 so that the first main surface of the substrate of the output matching circuit 13 faces the first main surface 91.

In the radio-frequency module 1 of the first embodiment, the end portion of each of the external connecting terminals 80 may include a gold plated layer, for example.

The circuit configuration of each of the radio-frequency modules 1 through 1e is not restricted to that described above. The radio-frequency modules 1 through 1e may include a radio-frequency front-end circuit supporting multiple-input multiple-output (MIMO).

The communication device 300 of the first embodiment may include one of the radio-frequency modules 1a through 1e instead of the radio-frequency module 1.

Second Embodiment

Figure 12:
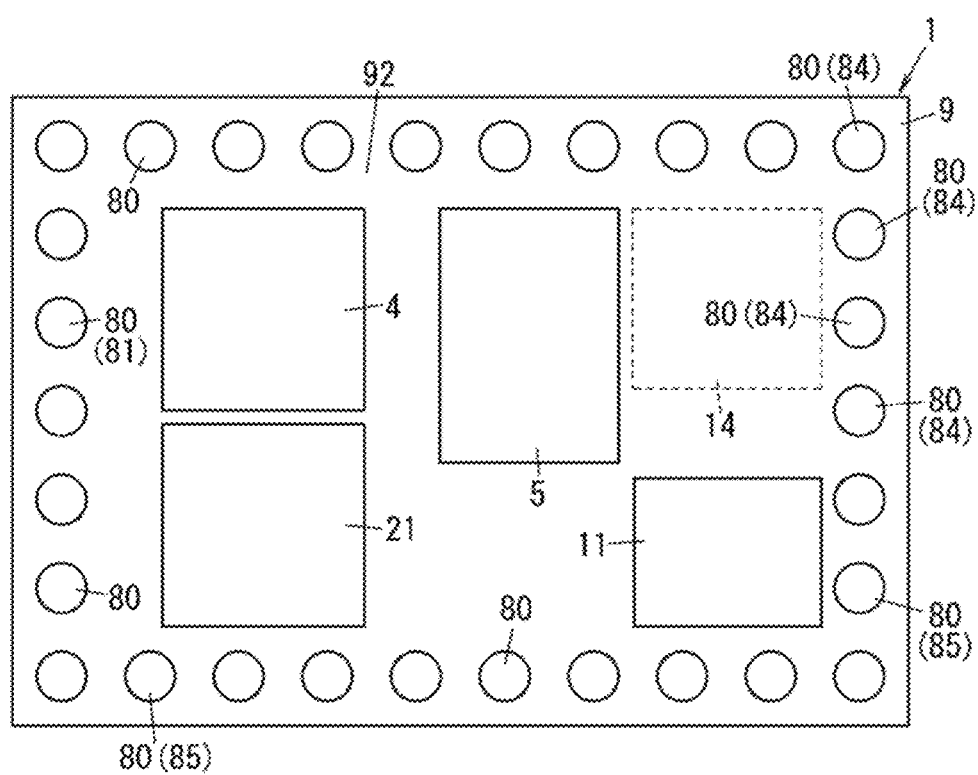
FIG. 12 is a bottom view of a radio-frequency module according to a second embodiment.

A radio-frequency module 1 according to a second embodiment will be described below with reference to FIG. 12. Elements of the radio-frequency module 1 of the second embodiment similar to those of the radio-frequency module 1 of the first embodiment are designated by like reference numerals, and an explanation thereof will be omitted suitably.

The radio-frequency module 1 of the second embodiment includes a mounting substrate 9, a power amplifier 11, and a controller 14. The mounting substrate 9 has first and second main surfaces 91 and 92 opposing each other. The power amplifier 11 is disposed on one of the first and second main surfaces 91 and 92 (the second main surface 92, in this example). The controller 14 is disposed on the other one of the first and second main surfaces 91 and 92 (the first main surface 91, in this example). The controller 14 controls the power amplifier 11.

The radio-frequency module 1 of the second embodiment is able to control the power amplifier 11 more stably.

The radio-frequency module 1 of the second embodiment also includes multiple external connecting terminals 80 disposed on the second main surface 92 of the mounting substrate 9. The power amplifier 11 is disposed on the second main surface 92 of the mounting substrate 9. The controller 14 is disposed on the first main surface 91 of the mounting substrate 9.

The radio-frequency module 1 of the second embodiment can easily dissipate heat generated in the power amplifier 11 via a circuit substrate, for example, on which the radio-frequency module 1 is mounted.

The communication device 300 of the first embodiment may use the radio-frequency module 1 of the second embodiment instead of that of the first embodiment.

Third Embodiment

A radio-frequency module 1f and a communication device 300f according to a third embodiment will be described below with reference to FIGS. 13 through 16B. Elements of the radio-frequency module 1f and the communication device 300f of the third embodiment similar to those of the radio-frequency module 1 and the communication device 300 of the first embodiment are designated by like reference numerals, and an explanation thereof will be omitted suitably.

Figure 13:
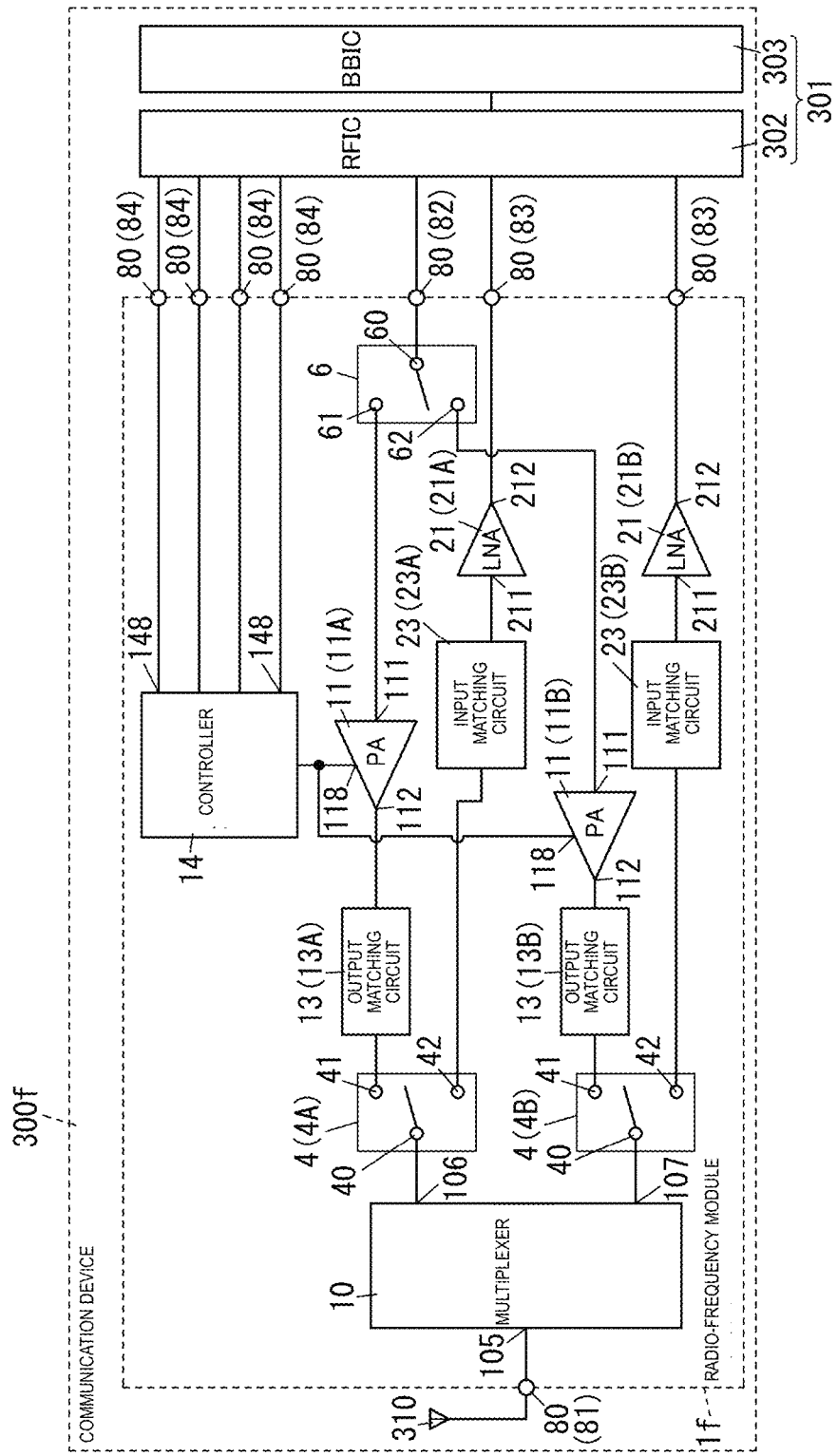
FIG. 13 is a circuit diagram of a communication device including a radio-frequency module of a third embodiment.

(3.1) Radio-Frequency Module and Communication Device (3.1.1) Circuit Configuration of Radio-Frequency Module and Communication Device The circuit configuration of the radio-frequency module 1f and the communication device 300f according to the third embodiment will be described below with reference to FIG. 13.

The radio-frequency module 1f is used in a multimode/multiband-support communication device, such as the communication device 300f, for example. The communication device 300f is a cellular phone, such as a smartphone, or may be another device, such as a wearable terminal (smartwatch, for example). The radio-frequency module 1f supports communication standards, such as 4G and 5G.

The radio-frequency module 1f can amplify a radio-frequency signal (transmit signal) received from a signal processing circuit 301 and output the amplified signal to an antenna 310 of the communication device 300f. The radio-frequency module 1f can also amplify a radio-frequency signal (received signal) input from the antenna 310 and output the amplified signal to the signal processing circuit 301. The signal processing circuit 301 is not a component of the radio-frequency module 1f but is a component of the communication device 300f including the radio-frequency module 1f. The radio-frequency module 1f is controlled by the signal processing circuit 301. The communication device 300f includes the radio-frequency module 1f and the signal processing circuit 301. The communication device 300f also includes the antenna 310.

The signal processing circuit 301 includes an RF signal processing circuit 302 and a baseband signal processing circuit 303.

The radio-frequency module 1f includes plural (two in the example in FIG. 13) power amplifiers 11 and a controller 14. The radio-frequency module 1f also includes a multiplexer 10, plural (two in the example in FIG. 13) first switches 4, a switch 6, plural (two in the example in FIG. 13) output matching circuits 13, plural (two in the example in FIG. 13) low-noise amplifiers 21, and plural (two in the example in FIG. 13) input matching circuits 23.

Figure 15:
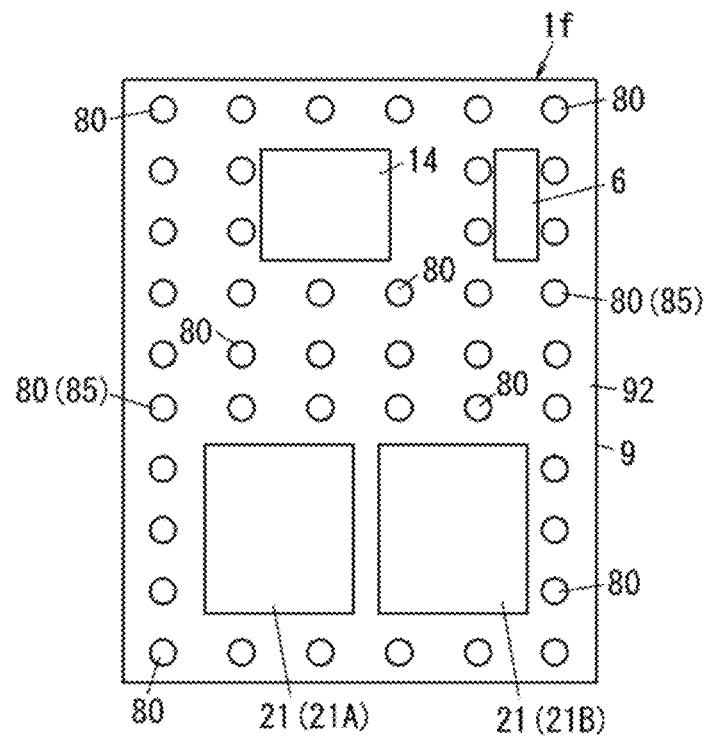
FIG. 15 is a plan view of the radio-frequency module of the third embodiment when a second main surface of a mounting substrate and electronic components and multiple external connecting terminals disposed on the second main surface are seen through from a first main surface of the mounting substrate.

The radio-frequency module 1f includes multiple external connecting terminals 80, such as an antenna terminal 81, a signal input terminal 82, plural (two in the example in FIG. 13) signal output terminal 83, plural (four in the example in FIG. 13) control terminals 84, and plural ground terminals 85 (see FIG. 15). The plural ground terminals 85 are electrically connected to a ground electrode of a circuit substrate of the communication device 300f and receive a ground potential.

The radio-frequency module 1f is different from the radio-frequency module 1 of the first embodiment in the following points. The radio-frequency module 1f includes the plural (two) power amplifiers 11, the two output matching circuits 13, the plural (two) low-noise amplifiers 21, the two input matching circuits 23, and the plural (two) first switches 4. The radio-frequency module 1f also includes the multiplexer 10 instead of the duplexers 32A through 32C of the radio-frequency module 1.

Hereinafter, for the sake of description, the following elements may also be called as follows. One of the two power amplifiers 11 may be called a first power amplifier 11A, and the other one of the power amplifiers 11 may be called a second power amplifier 11B. One of the two output matching circuits 13 may be called a first output matching circuit 13A, and the other one of the output matching circuits 13 may be called a second output matching circuit 13B. One of the two low-noise amplifiers 21 may be called a first low-noise amplifier 21A, and the other one of the low-noise amplifiers 21 may be called a second low-noise amplifier 21B. One of the two input matching circuits 23 may be called a first input matching circuit 23A, and the other one of the input matching circuits 23 may be called a second input matching circuit 23B. One of the two first switches 4 may be called a first switch 4A, and the other one of the first switches 4 may be called a first switch 4B.

The multiplexer 10 includes plural (two, for example) filters, one common terminal 105, and plural (two in the example in FIG. 13) terminals 106 and 107. The filters each has first and second input/output terminals. In the multiplexer 10, the first input/output terminals of the filters are connected to the common terminal 105, and the second input/output terminals of the filters are connected to the terminals 106 and 107 based on a one-on-one correspondence. The common terminal 105 is connected to the antenna terminal 81. The antenna terminal 81 is connected to the antenna 310.

In the multiplexer 10, the pass bands of the plural filters are different from each other. Hereinafter, for the sake of description, the filter connected between the common terminal 105 and the terminal 106 may also be called a first filter, while the filter connected between the common terminal 105 and the terminal 107 may also be called a second filter.

In the multiplexer 10, the pass band of the first filter includes the 5G NR n77 band, while that of the second filter includes the 5G NR n79 band. However, the pass band of the first filter and that of the second filter are not limited to the above-described combination of bands. For example, the pass band of the first filter may include the Wi-Fi (registered trademark) 2.4 GHz band, and that of the second filter may include the Wi-Fi (registered trademark) 5 GHz band.

In the radio-frequency module 1f, the two power amplifiers 11 are connected to the multiplexer 10. More specifically, the first power amplifier 11A is connected to the terminal 106 of the multiplexer 10 via the first switch 4A, while the second power amplifier 11B is connected to the terminal 107 of the multiplexer 10 via the first switch 4B.

The first switch 4A has a common terminal 40 and plural (two in the example in FIG. 13) selection terminals 41 and 42. The common terminal 40 of the first switch 4A is connected to the second input/output terminal of the first filter of the multiplexer 10. The selection terminal 41 of the first switch 4A is connected to an output terminal 112 of the first power amplifier 11A via the first output matching circuit 13A. The selection terminal 42 of the first switch 4A is connected to an input terminal 211 of the first low-noise amplifier 21A via the first input matching circuit 23A.

The first switch 4B has a common terminal 40 and plural (two in the example in FIG. 13) selection terminals 41 and 42. The common terminal 40 of the first switch 4B is connected to the second input/output terminal of the second filter of the multiplexer 10. The selection terminal 41 of the first switch 4B is connected to an output terminal 112 of the second power amplifier 11B via the second output matching circuit 13B. The selection terminal 42 of the first switch 4B is connected to an input terminal 211 of the second low-noise amplifier 21B via the second input matching circuit 23B.

Each of the two first switches 4 can connect at least one of the plural selection terminals 41 and 42 to the common terminal 40.

The two first switches 4 are controlled by the signal processing circuit 301, for example, and support the MIPI standard, for example. The first switches 4 each change the connection state between the common terminal 40 and the plural selection terminals 41 and 42, based on a control signal from the RF signal processing circuit 302 of the signal processing circuit 301, for example. The two first switches 4 are switch ICs, for example.

The two power amplifiers 11 are connected to the signal input terminal 82 via the switch 6. The switch 6 includes a common terminal 60 and plural (two in the example in FIG. 13) selection terminals 61 and 62. The common terminal 60 is connected to the signal input terminal 82. The selection terminal 61 is connected to an input terminal 111 of the first power amplifier 11A, while the selection terminal 62 is connected to an input terminal 111 of the second power amplifier 11B. The switch 6 is controlled by the signal processing circuit 301, for example, and supports the MIPI standard. The switch 6 changes the connection state between the common terminal 60 and the selection terminals 61 and 62 in accordance with a control signal from the RF signal processing circuit 302 of the signal processing circuit 301, for example. The switch 6 is a switch IC, for example.

The two power amplifiers 11 each amplify a radio-frequency signal (transmit signal) from the signal processing circuit 301 and outputs the amplified signal. The frequency band of a transmit signal amplified by one power amplifier 11 is different from that by the other power amplifier 11. The two power amplifiers 11 are controlled by the controller 14. The controller 14 is connected to the two power amplifiers 11. The controller 14 is also connected to the signal processing circuit 301 via the plural (four, for example) control terminals 84. The plural control terminals 84 are terminals via which a control signal from an external circuit, such as the signal processing circuit 301, is input into the controller 14. The controller 14 controls the two power amplifiers 11, based on a control signal input via the plural control terminals 84. The plural control terminals 84 support the MIPI standard, for example. As an input section for receiving a control signal, the controller 14 has plural terminals 148 corresponding to the plural control terminals 84. The plural terminals 148 support the MIPI standard, for example. In the radio-frequency module 1f of the third embodiment, the controller 14 is connected to input sections 118 of the respective two power amplifiers 11. The controller 14 controls the two power amplifiers 11 in accordance with a control signal from the RF signal processing circuit 302. The controller 14 receives the control signal from the RF signal processing circuit 302 by the plural terminals 148 and supplies a bias current to the power amplifiers 11 based on the control signal. The controller 14 may also control the two first switches 4 and the switch 6, as well as the two power amplifiers 11, based on the control signal.

The first output matching circuit 13A provides impedance matching between the first power amplifier 11A and the first switch 4A. The second output matching circuit 13B provides impedance matching between the second power amplifier 11B and the first switch 4B.

The input terminal 211 of the first low-noise amplifier 21A is connected to the selection terminal 42 of the first switch 4A via the first input matching circuit 23A. The input terminal 211 of the second low-noise amplifier 21B is connected to the selection terminal 42 of the first switch 4B via the second input matching circuit 23B. The first low-noise amplifier 21A amplifies a received signal input into the input terminal 211 and outputs the amplified received signal from an output terminal 212. The second low-noise amplifier 21B amplifies a received signal input into the input terminal 211 and outputs the amplified received signal from an output terminal 212. In the radio-frequency module 1f, the multiple external connecting terminals 80 include the two signal output terminals 83 that are connected to the output terminals 212 of the two low-noise amplifiers 21 based on a one-on-one correspondence. The two signal output terminals 83 are connected to the signal processing circuit 301 and are used for outputting radio-frequency signals (received signals) from the corresponding low-noise amplifiers 21 to an external circuit, such as the signal processing circuit 301.

The first input matching circuit 23A provides impedance matching between the first switch 4A and the first low-noise amplifier 21A. The second input matching circuit 23B provides impedance matching between the first switch 4B and the second low-noise amplifier 21B.

The radio-frequency module 1f includes the plural ground terminals 85 (see FIG. 15). The plural ground terminals 85 are electrically connected to the ground electrode of the above-described circuit substrate of the communication device 300f and receive a ground potential.

(3.1.2) Structure of Radio-Frequency Module

The structure of the radio-frequency module 1f will be discussed below with reference to FIGS. 14 through 16B.

Figure 14:
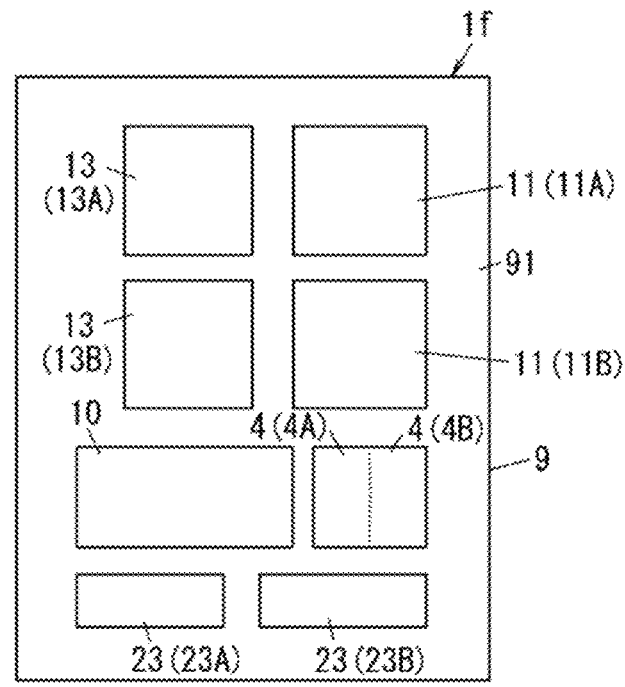
FIG. 14 is a plan view of the radio-frequency module of the third embodiment.
Figure 16A:
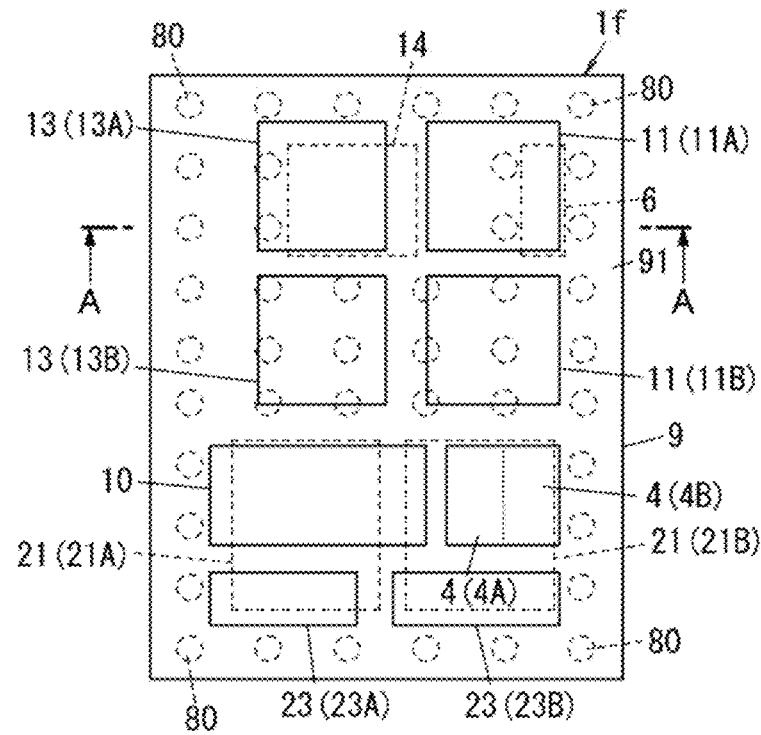
FIG. 16A is a plan view of the radio-frequency module of the third embodiment with the electronic components and multiple external connecting terminals disposed on the second main surface indicated by the broken lines.
Figure 16B:
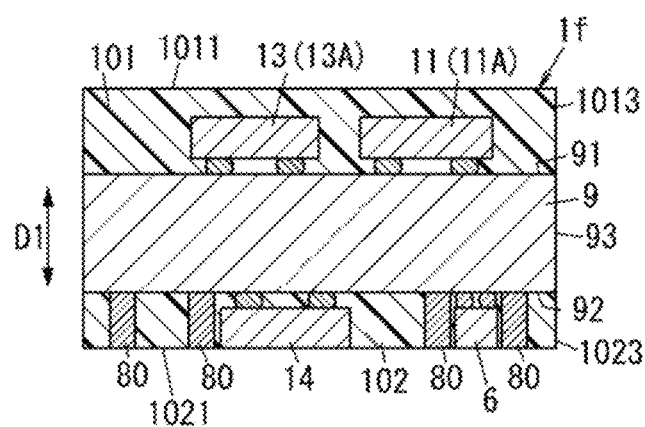
FIG. 16B is a sectional view of the radio-frequency module of the third embodiment taken along line A-A in FIG. 16A.

In the radio-frequency module 1f, as shown in FIGS. 14, 16A, and 16B, the multiplexer 10, the first switches 4A and 4B, and the two power amplifiers 11 are disposed on the first main surface 91 of the mounting substrate 9. The first switches 4A and 4B are formed into one chip, but may be formed as different chips. In the radio-frequency module 1f, elements (circuit elements) forming the first and second output matching circuits 13A and 13B and the first and second input matching circuits 23A and 23B are also disposed on the first main surface 91 of the mounting substrate 9.

In the radio-frequency module 1f, as shown in FIGS. 15, 16A, and 16B, the controller 14, the switch 6, and the two low-noise amplifiers 21 are disposed on the second main surface 92 of the mounting substrate 9.

(3.2) Conclusions (3.2.1) Radio-Frequency Module

The radio-frequency module 1f according to the third embodiment includes the mounting substrate 9, the two power amplifiers 11, and the controller 14. The mounting substrate 9 has the first and second main surfaces 91 and 92 opposing each other. The power amplifiers 11 are disposed on one of the first and second main surfaces 91 and 92 (the first main surface 91, in this example) of the mounting substrate 9. The controller 14 is disposed on the other one of the first and second main surfaces 91 and 92 (the second main surface 92, in this example) of the mounting substrate 9. The controller 14 controls the two power amplifiers 11.

The radio-frequency module 1f is able control the two power amplifiers 11 more stably.

In the radio-frequency module 1f, the two power amplifiers 11 are disposed on the first main surface 91 of the mounting substrate 9. This makes it easy to dissipate heat generated in the power amplifiers 11.

In the radio-frequency module 1f, the controller 14 is disposed on the second main surface 92 of the mounting substrate 9. This makes it less likely to cause the degradation of ACLR and a transmit signal, which would be caused by unwanted radiation of a control signal (digital signal of several to several dozens of megahertz) sent from an external circuit, such as the signal processing circuit 301.

In the radio-frequency module 1f, as shown in FIGS. 16A and 16B, footprints of the two power amplifiers 11 and do not overlap the footprint of the controller 14 in the thickness direction D1 of the mounting substrate 9. The controller 14 is thus less vulnerable to heat from the two power amplifiers 11.

Additionally, the first power amplifier 11A and the first output matching circuit 13A are adjacent to each other, as viewed in the thickness direction D1 of the mounting substrate 9. This means that the first power amplifier 11A and the first output matching circuit 13A are adjacent to each other on the first main surface 91 of the mounting substrate 9 without having any circuit element other than the first output matching circuit 13A on a straight line connecting the first power amplifier 11A and the circuit element of the first output matching circuit 13A positioned most closely to the first power amplifier 11A. With this arrangement, the wiring between the output terminal 112 of the first power amplifier 11A and the first output matching circuit 13A can be made short. This can reduce unwanted parasitic capacitance and accordingly improve the transmission characteristics of the radio-frequency module 1f. The short wiring between the output terminal 112 of the first power amplifier 11A and the first output matching circuit 13A can also reduce insertion loss.

Additionally, the second power amplifier 11B and the second output matching circuit 13B are adjacent to each other, as viewed in the thickness direction D1 of the mounting substrate 9. This means that the second power amplifier 11B and the second output matching circuit 13B are adjacent to each other on the first main surface 91 of the mounting substrate 9 without having any circuit element other than the second output matching circuit 13B on a straight line connecting the second power amplifier 11B and the circuit element of the second output matching circuit 13B positioned most closely to the second power amplifier 11B. With this arrangement, the wiring between the output terminal 112 of the second power amplifier 11B and the second output matching circuit 13B can be made short. This can reduce unwanted parasitic capacitance and accordingly improve the transmission characteristics of the radio-frequency module 1f. The short wiring between the output terminal 112 of the second power amplifier 11B and the second output matching circuit 13B can also reduce insertion loss.

In the radio-frequency module 1f, the controller 14 is disposed on the second main surface 92 of the mounting substrate 9, while the power amplifiers 11 and the output matching circuits 13 are disposed on the first main surface 91 of the mounting substrate 9. This enhances the isolation between the controller 14 and each of the power amplifiers 11 and the output matching circuits 13. It is also possible to separate a control signal based on the MIPI standard and a transmit signal from each other by the mounting substrate 9.

(3.2.2) Communication Device

The communication device 300f according to the third embodiment includes the radio-frequency module 1f and the signal processing circuit 301. The signal processing circuit 301 is connected to the radio-frequency module 1f. The signal processing circuit 301 processes a transmit signal to be sent to the antenna 310 and also processes a received signal sent from the antenna 310. The radio-frequency module 1f transfers a transmit signal and a received signal between the antenna 310 and the signal processing circuit 301.

The communication device 300f of the third embodiment includes the radio-frequency module 1f and can thus control the plural power amplifiers 11 more stably.

(3.3) Modified Examples of Radio-Frequency Module

(3.3.1) First Modified Example

A radio-frequency module 1g according to a first modified example of the third embodiment will be described below with reference to FIGS. 17 through 19B. Elements of the radio-frequency module 1g of the first modified example similar to those of the radio-frequency module 1f of the third embodiment are designated by like reference numerals, and an explanation thereof will be omitted.

Figure 17:
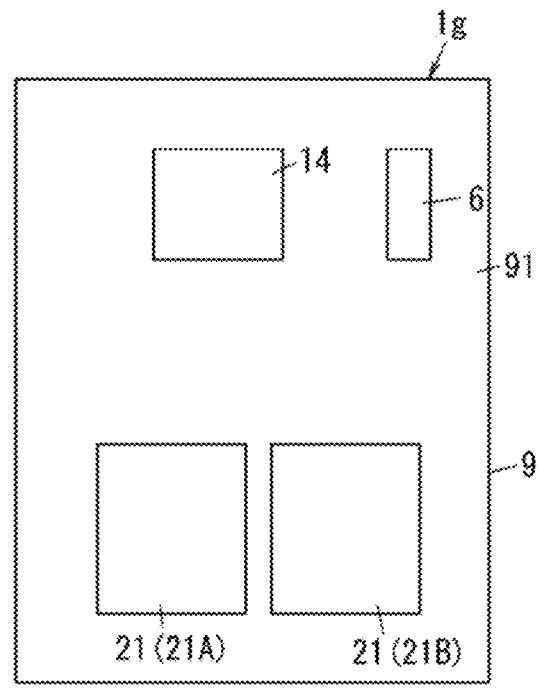
FIG. 17 is a plan view of a radio-frequency module according to a first modified example of the third embodiment.
Figure 19A:
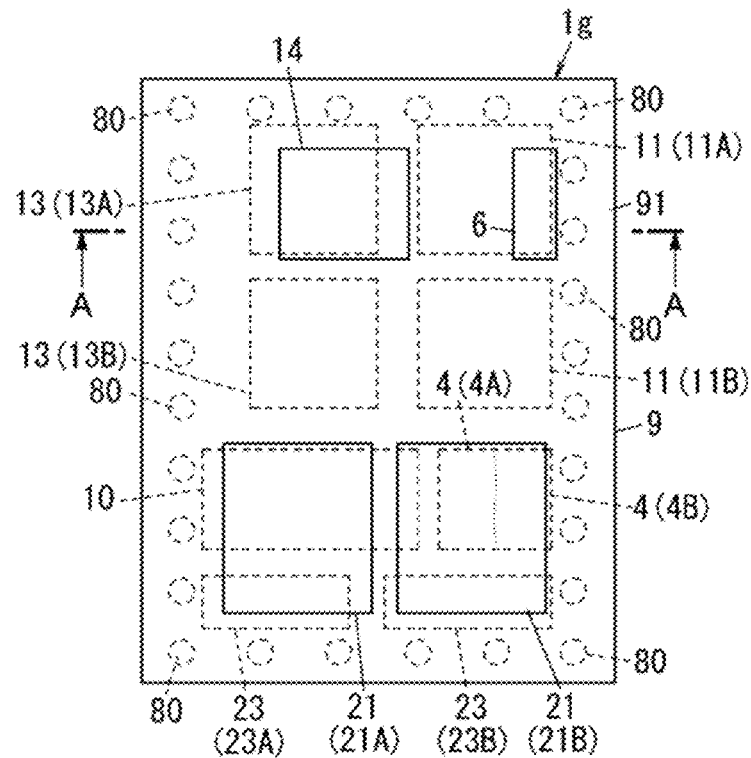
FIG. 19A is a plan view of the radio-frequency module of the first modified example of the third embodiment with the electronic components and multiple external connecting terminals disposed on the second main surface indicated by the broken lines.
Figure 19B:
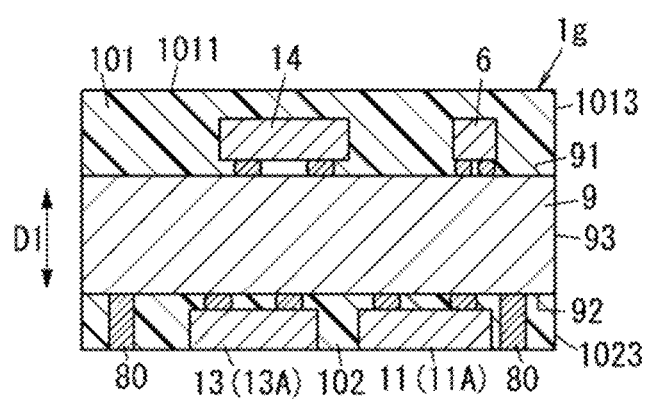
FIG. 19B is a sectional view of the radio-frequency module of the first modified example of the third embodiment taken along line A-A in FIG. 19A.

In the radio-frequency module 1g, as shown in FIGS. 17, 19A, and 19B, the controller 14, the switch 6, and the two low-noise amplifiers 21 are disposed on the first main surface 91 of the mounting substrate 9.

Figure 18:
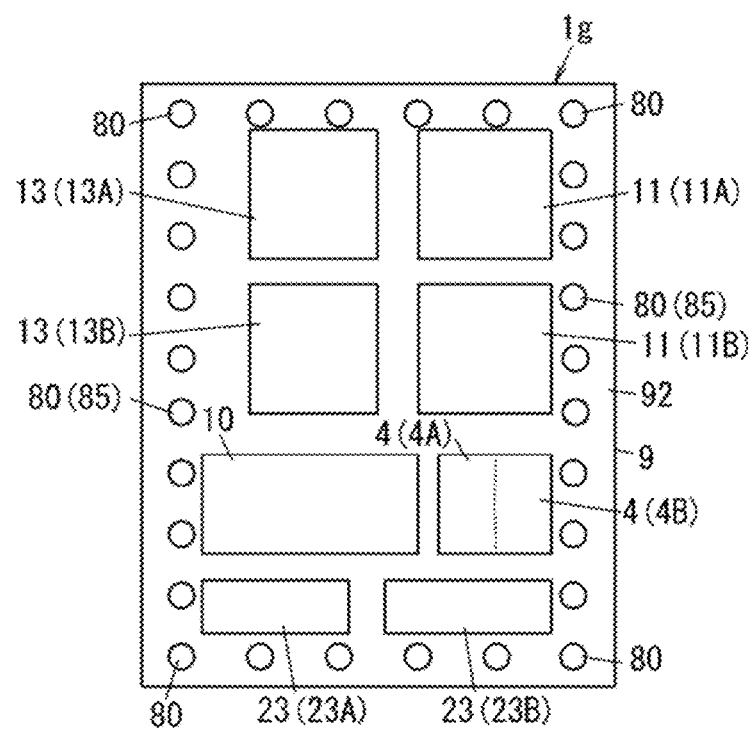
FIG. 18 is a plan view of the radio-frequency module of the first modified example of the third embodiment when a second main surface of a mounting substrate and electronic components and multiple external connecting terminals disposed on the second main surface are seen through from a first main surface of the mounting substrate.

In the radio-frequency module 1g, as shown in FIGS. 18, 19A, and 19B, the multiplexer 10, the first switches 4A and 4B, and the two power amplifiers 11 are disposed on the second main surface 92 of the mounting substrate 9. The first switches 4A and 4B are formed into one chip, but may be formed as different chips. In the radio-frequency module 1g, elements (circuit elements) forming the first and second output matching circuits 13A and 13B and the first and second input matching circuits 23A and 23B are also disposed on the second main surface 92 of the mounting substrate 9. As shown in FIGS. 19A and 19B, the footprint of the controller 14 and the footprints of two power amplifiers 11 do not overlap each other, as viewed in the thickness direction D1 of the mounting substrate 9.

The radio-frequency module 1g according to the first modified example of the third embodiment includes the mounting substrate 9, the two power amplifiers 11, and the controller 14. The mounting substrate 9 has the first and second main surfaces 91 and 92 opposing each other. The two power amplifiers 11 are disposed on one of the first and second main surfaces 91 and 92 (the second main surface 92, in this example) of the mounting substrate 9. The controller 14 is disposed on the other one of the first and second main surfaces 91 and 92 (the first main surface 91, in this example) of the mounting substrate 9. The controller 14 controls the two power amplifiers 11.

The radio-frequency module 1g is able to control the two power amplifiers 11 more stably.

(3.3.2) Second Modified Example

A radio-frequency module 1h according to a second modified example of the third embodiment will be described below with reference to FIGS. 20 through 22. Elements of the radio-frequency module 1h of the second modified example similar to those of the radio-frequency module 1f of the third embodiment are designated by like reference numerals, and an explanation thereof will be omitted.

Figure 20:
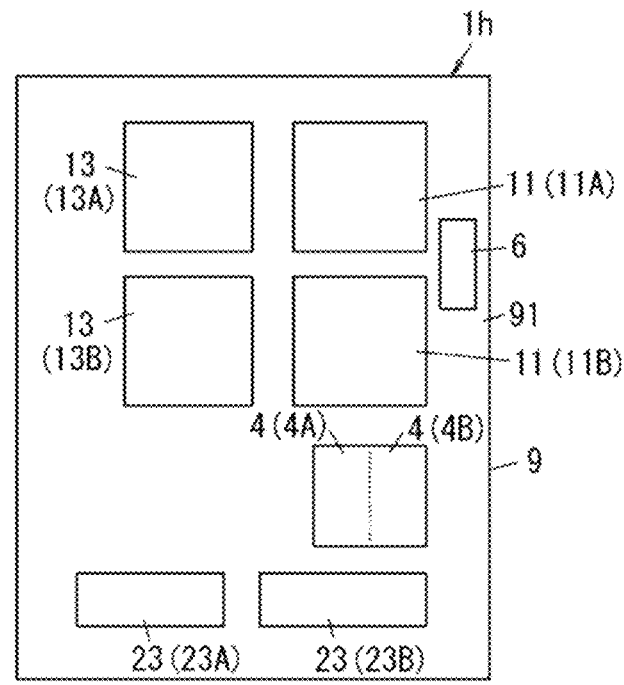
FIG. 20 is a plan view of a radio-frequency module according to a second modified example of the third embodiment.
Figure 22:
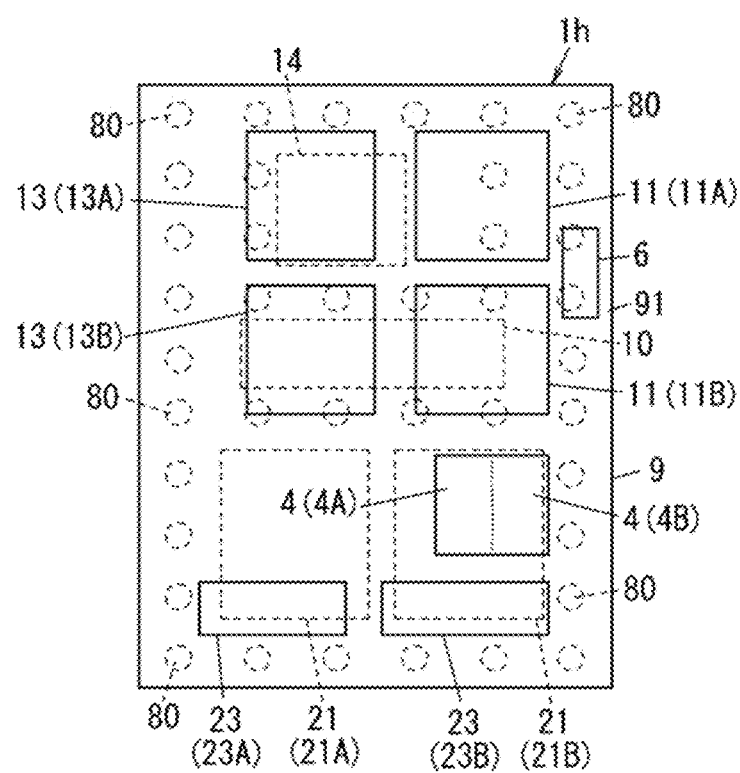
FIG. 22 is a plan view of the radio-frequency module of the second modified example of the third embodiment with the electronic components and multiple external connecting terminals disposed on the second main surface indicated by the broken lines.

In the radio-frequency module 1h, as shown in FIGS. 20 and 22, the first switches 4A and 4B, the two power amplifiers 11, and the switch 6 are disposed on the first main surface 91 of the mounting substrate 9. The first switches 4A and 4B are formed into one chip, but may be formed as different chips. In the radio-frequency module 1h, elements (circuit elements) forming the first and second output matching circuits 13A and 13B and the first and second input matching circuits 23A and 23B are also disposed on the first main surface 91 of the mounting substrate 9.

Figure 21:
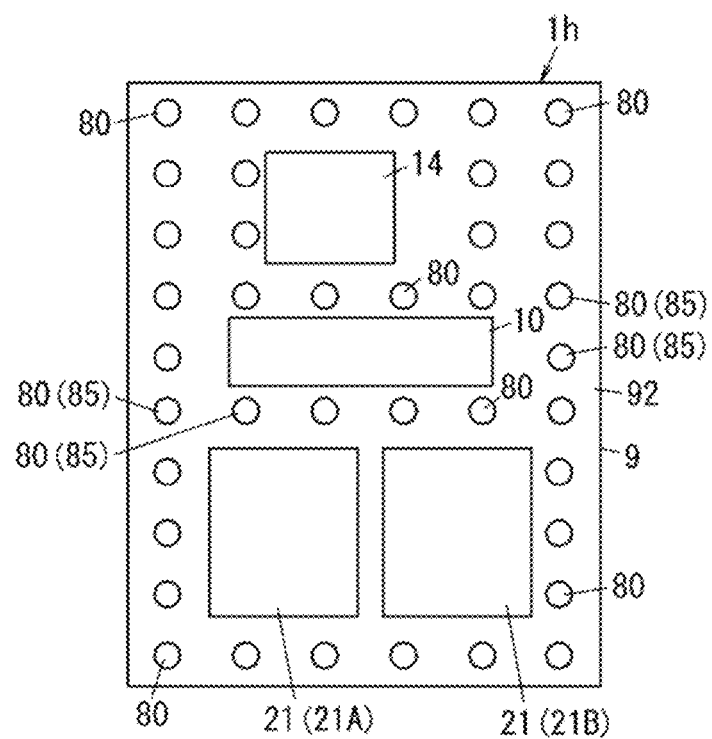
FIG. 21 is a plan view of the radio-frequency module of the second modified example of the third embodiment when a second main surface of a mounting substrate and electronic components and multiple external connecting terminals disposed on the second main surface are seen through from a first main surface of the mounting substrate.

In the radio-frequency module 1h, as shown in FIGS. 21 and 22, the multiplexer 10, the controller 14, and the two low-noise amplifiers 21 are disposed on the second main surface 92 of the mounting substrate 9.

In the radio-frequency module 1h, the positions of the multiplexer 10 and the switch 6 are different from those of the radio-frequency module 1f of the third embodiment.

The radio-frequency module 1h according to the second modified example of the third embodiment includes the mounting substrate 9, the two power amplifiers 11, and the controller 14. The mounting substrate 9 has the first and second main surfaces 91 and 92 opposing each other. The two power amplifiers 11 are disposed on one of the first and second main surfaces 91 and 92 (the first main surface 91, in this example) of the mounting substrate 9. The controller 14 is disposed on the other one of the first and second main surfaces 91 and 92 (the second main surface 92, in this example) of the mounting substrate 9. The controller 14 controls the two power amplifiers 11.

The radio-frequency module 1h is able to control the two power amplifiers 11 more stably.

In the radio-frequency module 1h of the second modified example, the multiplexer 10 is surrounded by the multiple ground terminals 85, as viewed in the thickness direction D1 of the mounting substrate 9. The characteristics of the multiplexer 10 are thus less likely to deteriorate.

Fourth Embodiment

A radio-frequency module 1i and a communication device 300i according to a fourth embodiment will be described below with reference to FIGS. 23 through 26B. Elements of the radio-frequency module 1i and the communication device 300i of the fourth embodiment similar to those of the radio-frequency module 1 and the communication device 300 of the first embodiment are designated by like reference numerals, and an explanation thereof will be omitted suitably.

(4.1) Radio-Frequency Module and Communication Device

(4.1.1) Overview of Radio-Frequency Module and Communication Device

Figure 23:
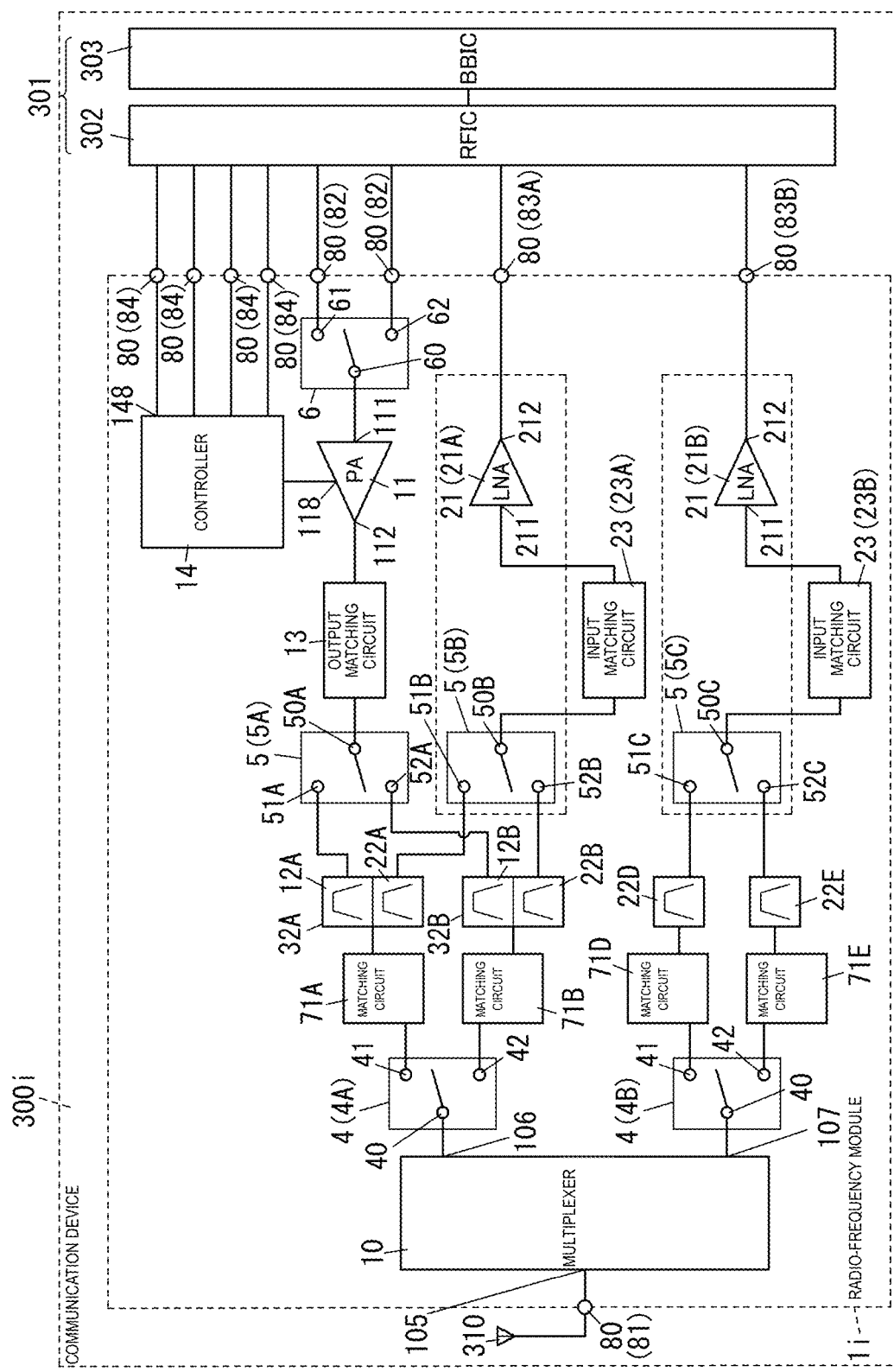
FIG. 23 is a circuit diagram of a communication device including a radio-frequency module of a fourth embodiment.

The circuit configuration of the radio-frequency module 1i and the communication device 300i according to the fourth embodiment will be described below with reference to FIG. 23.

The radio-frequency module 1i is used in the communication device 300i, for example. The communication device 300i is a cellular phone, such as a smartphone, or may be another device, such as a wearable terminal (smartwatch, for example). The radio-frequency module 1i supports communication standards, such as 4G and 5G. 4G is 3GPP LTE, for example. 5G is 5G NR, for example. The radio-frequency module 1i also supports carrier aggregation and dual connectivity.

The radio-frequency module 1i can amplify a radio-frequency signal (transmit signal) received from a signal processing circuit 301 and output the amplified signal to an antenna 310 of the communication device 300i. The radio-frequency module 1i can also amplify a radio-frequency signal (received signal) input from the antenna 310 and output the amplified signal to the signal processing circuit 301. The signal processing circuit 301 is not a component of the radio-frequency module 1i but is a component of the communication device 300i including the radio-frequency module 1i. The radio-frequency module 1i is controlled by the signal processing circuit 301. The communication device 300i includes the radio-frequency module 1i and the signal processing circuit 301. The communication device 300i also includes the antenna 310 and a circuit substrate on which the radio-frequency module 1i is mounted. The circuit substrate is a printed wiring board, for example, and includes a ground electrode to which a ground potential is supplied.

The signal processing circuit 301 includes an RF signal processing circuit 302 and a baseband signal processing circuit 303. The radio-frequency module 1i transfers radio-frequency signals (transmit signals and received signals) between the antenna 310 and the RF signal processing circuit 302 of the signal processing circuit 301.

The radio-frequency module 1i includes a power amplifier 11 and a controller 14. The radio-frequency module 1i also includes a multiplexer 10, plural (two in the example in FIG. 23) first switches 4, plural (two in the example in FIG. 23) duplexers 32A and 32B, an output matching circuit 13, a switch 6, plural (two in the example in FIG. 23) low-noise amplifiers 21, plural (two in the example in FIG. 23) input matching circuits 23, plural (two in the example in FIG. 23) receive filters 22D and 22E, plural (three in the example in FIG. 23) second switches 5, and plural (four in the example in FIG. 23) matching circuits 71A, 71B, 71D, and 71E.

Hereinafter, for the sake of description, the following elements may also be called as follows. One of the two low-noise amplifiers 21 may be called a first low-noise amplifier 21A, and the other one of the low-noise amplifiers 21 may be called a second low-noise amplifier 21B. One of the two input matching circuits 23 may be called a first input matching circuit 23A, and the other one of the input matching circuits 23 may be called a second input matching circuit 23B. One of the two first switches 4 may be called a first switch 4A, and the other one of the first switches 4 may be called a first switch 4B. Among the three second switches 5, the second switch 5 connected to the output matching circuit 13 may be called a second switch 5A, the second switch 5 connected to the first input matching circuit 23A may be called a second switch 5B, and the second switch 5 connected to the second input matching circuit 23B may be called a second switch 5C.

The multiplexer 10 includes plural (two, for example) filters, one common terminal 105, and plural (two in the example in FIG. 23) terminals 106 and 107. The filters each has first and second input/output terminals. In the multiplexer 10, the first input/output terminals of the filters are connected to the common terminal 105, and the second input/output terminals of the filters are connected to the terminals 106 and 107 based on a one-on-one correspondence. The common terminal 105 is connected to the antenna terminal 81. The antenna terminal 81 is connected to the antenna 310. The terminal 106 of the multiplexer 10 is connected to a common terminal 40 of the first switch 4A, while the terminal 107 of the multiplexer 10 is connected to a common terminal 40 of the first switch 4B.

In the multiplexer 10, the pass bands of the plural filters are different from each other. Hereinafter, for the sake of description, the filter connected between the common terminal 105 and the terminal 106 may also be called a first filter, while the filter connected between the common terminal 105 and the terminal 107 may also be called a second filter.

In the multiplexer 10, the pass band of the second filter is lower than that of the first filter, for example. The first filter is a mid/high-band filter, while the second filter is a low-band filter. The pass band of the first filter includes any of Band 1, Band 3, Band 4, Band 11, Band 25, Band 70, Band 34, Band 39, Band 7, Band 30, Band 40, Band 41, Band 53, n75, and n76, for example. The pass band of the second filter includes any of Band 71, Band 28A, Band 28B, Band 12, Band 13, Band 14, Band 20, Band 26, and Band 8, for example. The radio-frequency module 1i of the fourth embodiment is a diversity module that achieves reception of mid/high-band received signals and low-band received signals.

In the radio-frequency module 1i, the first switches 4A and 4B each have the common terminal 40 and selection terminals 41 and 42. The selection terminal 41 of the first switch 4A is connected to the duplexer 32A via the matching circuit 71A, while the selection terminal 42 of the first switch 4A is connected to the duplexer 32B via the matching circuit 71B. The duplexer 32A includes a transmit filter 12A and a receive filter 22A. The duplexer 32B includes a transmit filter 12B and a receive filter 22B.

An input terminal 111 of the power amplifier 11 is connected to plural (two in the example in FIG. 23) signal input terminals 82 via the switch 6. The switch 6 has a common terminal 60 and plural (two in the example in FIG. 23) selection terminals 61 and 62. The common terminal 60 is connected to the input terminal 111 of the power amplifier 11. The plural selection terminals 61 and 62 of the switch 6 are connected to the signal input terminals 82 based on a one-on-one correspondence.

The output terminal 112 of the power amplifier 11 is connected to the two duplexers 32A and 32B via the output matching circuit 13 and the second switch 5A. The second switch 5A has a common terminal 50A and two selection terminals 51A and 52A. The common terminal 50A is connected to the output matching circuit 13. The selection terminal 51A is connected to the transmit filter 12A of the duplexer 32A, while the selection terminal 52A is connected to the transmit filter 12B of the duplexer 32B.

An input terminal 211 of the first low-noise amplifier 21A is connected to the two duplexers 32A and 32B via the first input matching circuit 23A and the second switch 5B. The second switch 5B has a common terminal 50B and two selection terminals 51B and 52B. The common terminal 50B is connected to the first input matching circuit 23A. The selection terminal 51B is connected to the receive filter 22A of the duplexer 32A, while the selection terminal 52B is connected to the receive filter 22B of the duplexer 32B.

An output terminal 212 of the first low-noise amplifier 21A is connected to a signal output terminal 83A included in the multiple external connecting terminals 80.

In the radio-frequency module 1i, the selection terminal 41 of the first switch 4B is connected to the receive filter 22D via the matching circuit 71D, while the selection terminal 42 of the first switch 4B is connected to the receive filter 22E via the matching circuit 71E.

An input terminal 211 of the second low-noise amplifier 21B is connected to the two receive filters 22D and 22E via the second input matching circuit 23B and the second switch 5C. The second switch 5C has a common terminal 50C and two selection terminals 51C and 52C. The common terminal 50C is connected to the second input matching circuit 23B. The selection terminal 51C is connected to the receive filter 22D, while the selection terminal 52C is connected to the receive filter 22E.

An output terminal 212 of the second low-noise amplifier 21B is connected to a signal output terminal 83B included in the multiple external connecting terminals 80.

The two matching circuits 71D and 71E are each constituted by one inductor, for example, or may include plural inductors and plural capacitors.

(4.1.2) Structure of Radio-Frequency Module

The structure of the radio-frequency module 1i will be discussed below with reference to FIGS. 24 through 26B.

Figure 24:
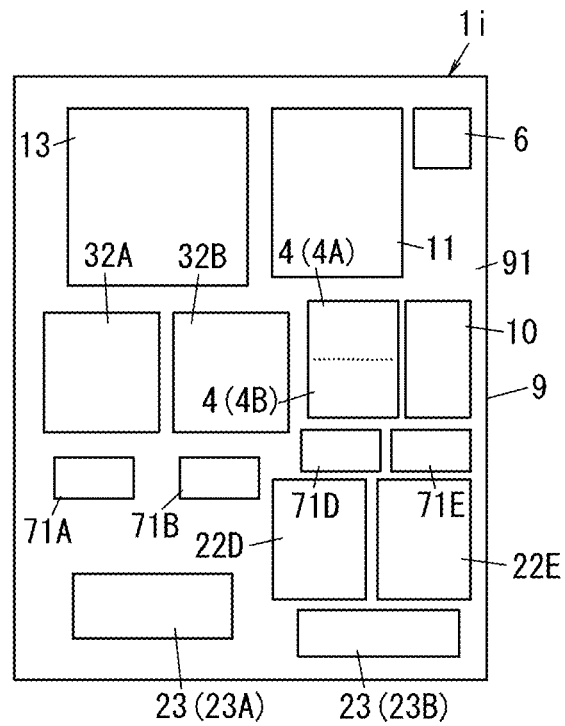
FIG. 24 is a plan view of the radio-frequency module of the fourth embodiment.
Figure 26A:
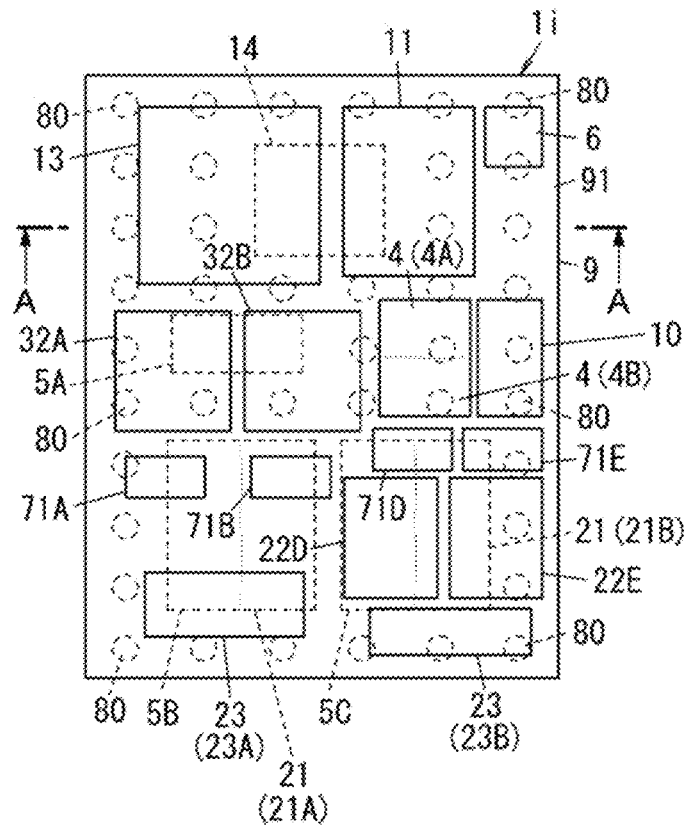
FIG. 26A is a plan view of the radio-frequency module of the fourth embodiment with the electronic components and multiple external connecting terminals disposed on the second main surface indicated by the broken lines.
Figure 26B:
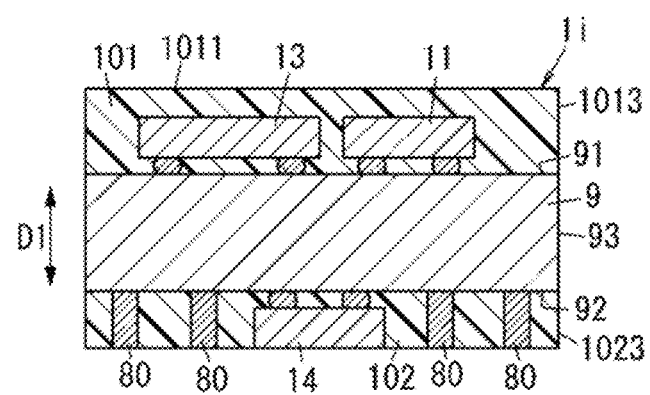
FIG. 26B is a sectional view of the radio-frequency module of the fourth embodiment taken along line A-A in FIG. 26A.

In the radio-frequency module 1i, as shown in FIGS. 24, 26A, and 26B, the multiplexer 10, the first switches 4A and 4B, the switch 6, and the power amplifier 11 are disposed on the first main surface 91 of the mounting substrate 9. The first switches 4A and 4B are formed into one chip, but may be formed as different chips. In the radio-frequency module 1i, elements (circuit elements) forming the four matching circuits 71A, 71B, 71D, and 71E, the output matching circuit 13, and the first and second input matching circuits 23A and 23B are also disposed on the first main surface 91 of the mounting substrate 9. The two duplexers 32A and 32B and the two receive filters 22D and 22E are also disposed on the first main surface 91 of the mounting substrate 9. Each of the two receive filters 22D and 22E is an acoustic wave filter and is constituted by plural series arm resonators and plural parallel arm resonators, each of which is an acoustic wave resonator. An example of the acoustic wave filter is a SAW filter using SAWs. Each of the plural series arm resonators and the plural parallel arm resonators forming a SAW filter is a SAW resonator.

Each of the two receive filters 22D and 22E includes a substrate having first and second main surfaces and a circuit formed on the first main surface of this substrate. The substrate may be a piezoelectric substrate, such as a lithium tantalate substrate or a lithium niobate substrate. The circuit includes multiple IDT electrodes associated with the series arm resonators based on a one-on-one correspondence and multiple IDT electrodes associated with the parallel arm resonators based on a one-on-one correspondence. The two receive filters 22D and 22E are disposed on the first main surface 91 of the mounting substrate 9 so that the first main surfaces of the substrates of the receive filters 22D and 22E face the mounting substrate 9. The outer shape of each of the two receive filters 22D and 22E is substantially quadrilateral, as viewed in the thickness direction D1 of the mounting substrate 9.

Figure 25:
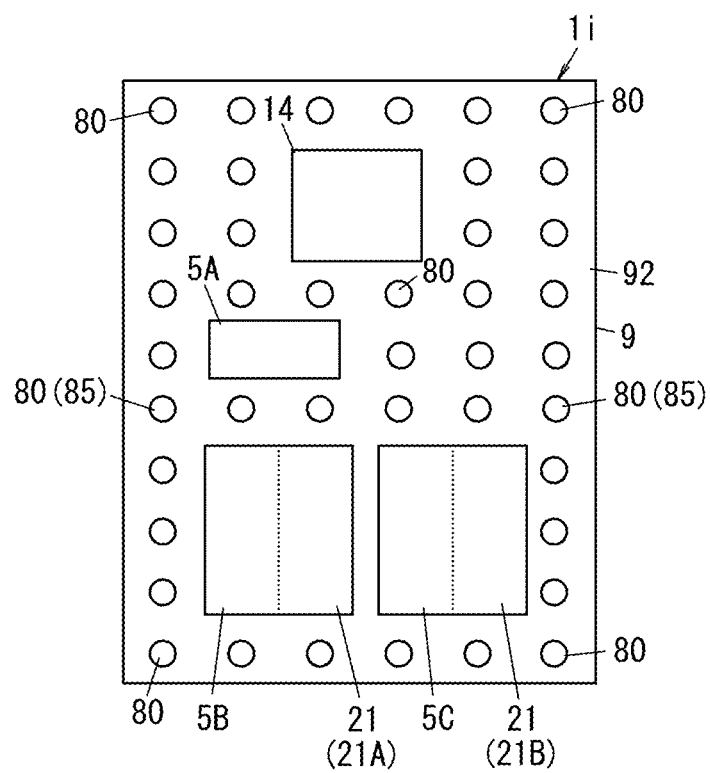
FIG. 25 is a plan view of the radio-frequency module of the fourth embodiment when a second main surface of a mounting substrate and electronic components and multiple external connecting terminals disposed on the second main surface are seen through from a first main surface of the mounting substrate.

As shown in FIGS. 25, 26A, and 26B, the controller 14, the three second switches 5A, 5B, and 5C, and the two low-noise amplifiers 21 are disposed on the second main surface 92 of the mounting substrate 9. In the radio-frequency module 1i, the first low-noise amplifier 21A and the second switch 5B are formed into one chip, but may be formed as different chips. Likewise, the second low-noise amplifier 21B and the second switch 5C are formed into one chip, but may be formed as different chips.

(4.2) Conclusions

(4.2.1) Radio-Frequency Module

The radio-frequency module 1i according to the fourth embodiment includes the mounting substrate 9, the power amplifier 11, and the controller 14. The mounting substrate 9 has the first and second main surfaces 91 and 92 opposing each other. The power amplifier 11 is disposed on one of the first and second main surfaces 91 and 92 (the first main surface 91, in this example) of the mounting substrate 9. The controller 14 is disposed on the other one of the first and second main surfaces 91 and 92 (the second main surface 92, in this example) of the mounting substrate 9. The controller 14 controls the power amplifier 11.

The radio-frequency module 1i is able to control the power amplifier 11 more stably.

In the radio-frequency module 1i, the power amplifier 11 is disposed on the first main surface 91 of the mounting substrate 9. This makes it easy to dissipate heat generated in the power amplifier 11.

In the radio-frequency module 1i, the controller 14 is disposed on the second main surface 92 of the mounting substrate 9. This makes it less likely to cause the degradation of ACLR and a transmit signal, which would be caused by unwanted radiation of a control signal (digital signal of several to several dozens of megahertz) sent from an external circuit, such as the signal processing circuit 301.

In the radio-frequency module 1i, as shown in FIGS. 26A and 26B, the footprint of the power amplifier 11 and the footprint of the controller 14 at least partially overlap in the thickness direction D1 of the mounting substrate 9. It is thus possible to reduce the length of wiring connecting the controller 14 and the power amplifier 11 while making it less likely to transfer heat from the power amplifier 11 to the controller 14.

Additionally, in the radio-frequency module 1i, the power amplifier 11 and the output matching circuit 13 are adjacent to each other, as viewed in the thickness direction D1 of the mounting substrate 9. This means that the power amplifier 11 and the output matching circuit 13 are adjacent to each other on the first main surface 91 of the mounting substrate 9 without having any circuit element other than the output matching circuit 13 on a straight line connecting the power amplifier 11 and the circuit element of the output matching circuit 13 positioned most closely to the power amplifier 11. With this arrangement, the wiring between the output terminal 112 of the power amplifier 11 and the output matching circuit 13 can be made short. This can reduce unwanted parasitic capacitance and accordingly improve the transmission characteristics of the radio-frequency module 1i. The short wiring between the output terminal 112 of the power amplifier 11 and the output matching circuit 13 can also reduce insertion loss.

Additionally, in the radio-frequency module 1i, the footprint of the power amplifier 11 does not overlap the footprints of the two low-noise amplifiers 21, as viewed in the thickness direction D1 of the mounting substrate 9. This can enhance the isolation between the amplifier 11 and the two low-noise amplifiers 21. In the radio-frequency module 1i, the mounting substrate 9 is substantially rectangular as viewed in the thickness direction D1 of the mounting substrate 9. As viewed in the thickness direction D1 of the mounting substrate 9, the power amplifier 11 is located at one end of the mounting substrate 9 in the longitudinal direction, while the two low-noise amplifiers 21 are located at the other end of the mounting substrate 9 in the longitudinal direction. As viewed in the thickness direction D1 of the mounting substrate 9, the power amplifier 11 is located along one of the two short sides (also called a first short side) of the mounting substrate 9, while the two low-noise amplifiers 21 are located along the other short side (also called a second short side) of the mounting substrate 9. As viewed in the thickness direction D1 of the mounting substrate 9, the distance between the power amplifier 11 and each of the low-noise amplifiers 21 in the longitudinal direction of the mounting substrate 9 is longer than a first distance between the power amplifier 11 and the first short side of the mounting substrate 9 and a second distance between the two low-noise amplifiers 21 and the second short side of the mounting substrate 9. This can further enhance the isolation between the power amplifier 11 and the two low-noise amplifiers 21.

In the radio-frequency module 1i, the controller 14 is disposed on the second main surface 92 of the mounting substrate 9, while the power amplifier 11 and the output matching circuit 13 are disposed on the first main surface 91 of the mounting substrate 9. This enhances the isolation between the controller 14 and each of the power amplifier 11 and the output matching circuit 13. It is also possible to separate a control signal based on the MIPI standard and a transmit signal from each other by the mounting substrate 9.

(4.2.2) Communication Device

The communication device 300i according to the fourth embodiment includes the radio-frequency module 1i and the signal processing circuit 301. The signal processing circuit 301 is connected to the radio-frequency module 1i. The signal processing circuit 301 processes a transmit signal to be sent to the antenna 310. The radio-frequency module 1i transfers a transmit signal between the antenna 310 and the signal processing circuit 301.

The communication device 300i of the fourth embodiment includes the radio-frequency module 1i and can thus control the power amplifier 11 more stably.

Figure 27:
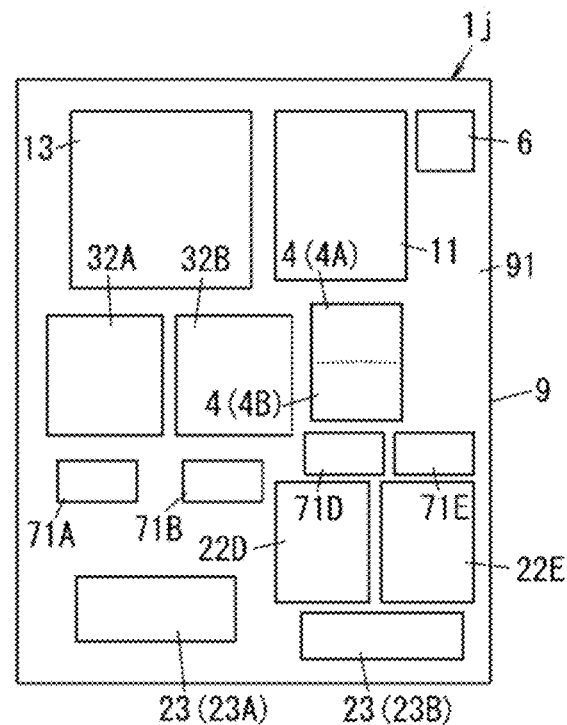
FIG. 27 is a plan view of a radio-frequency module according to a first modified example of the fourth embodiment.
Figure 28:
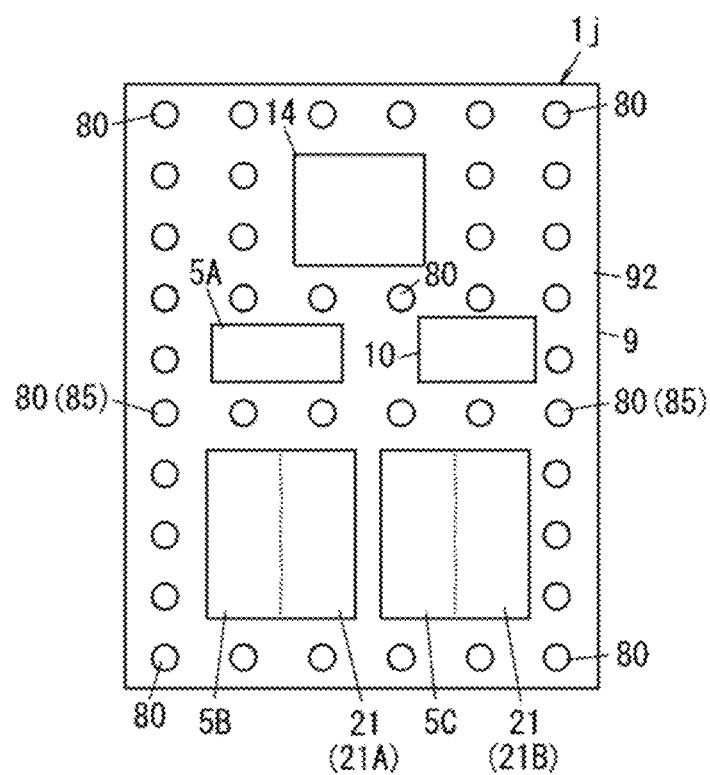
FIG. 28 is a plan view of the radio-frequency module of the first modified example of the fourth embodiment when a second main surface of a mounting substrate and electronic components and multiple external connecting terminals disposed on the second main surface are seen through from a first main surface of the mounting substrate.
Figure 29:
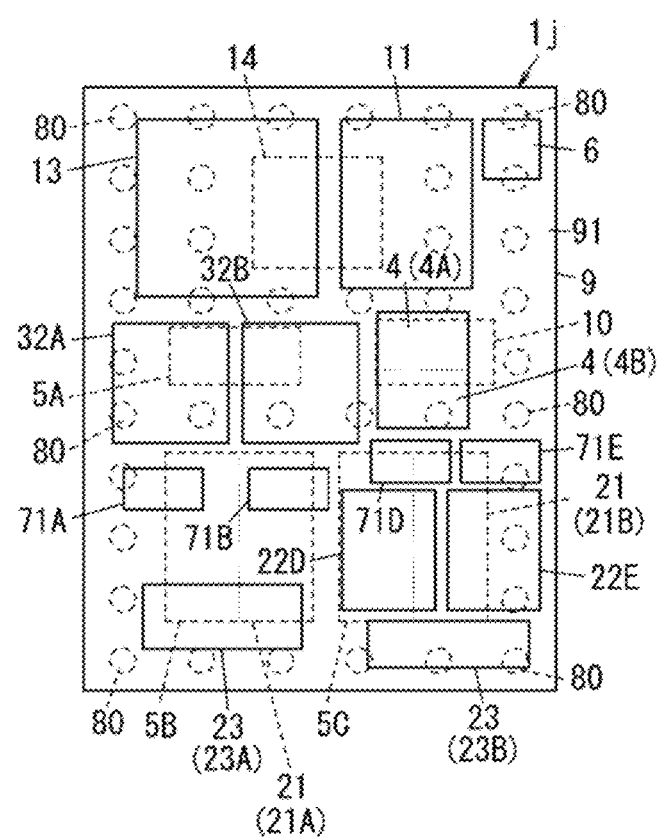
FIG. 29 is a plan view of the radio-frequency module of the first modified example of the fourth embodiment with the electronic components and multiple external connecting terminals disposed on the second main surface indicated by the broken lines.

(4.3) Modified Examples of Radio-Frequency Module (4.3.1) First Modified Example A radio-frequency module 1j according to a first modified example of the fourth embodiment will be described below with reference to FIGS. 27 through 29. Elements of the radio-frequency module 1j of the first modified example similar to those of the radio-frequency module 1i of the fourth embodiment are designated by like reference numerals, and an explanation thereof will be omitted.

The radio-frequency module 1j of the first modified example is different from the radio-frequency module 1i in that the multiplexer 10 is disposed on the second main surface 92 of the mounting substrate 9 instead of on the first main surface 91.

The radio-frequency module 1j, as well as the radio-frequency module 1i, is able to control the power amplifier 11 more stably.

(4.3.2) Second Modified Example

A radio-frequency module 1k according to a second modified example of the fourth embodiment will be described below with reference to FIGS. 30 through 32B. Elements of the radio-frequency module 1k of the second modified example similar to those of the radio-frequency module 1i of the fourth embodiment are designated by like reference numerals, and an explanation thereof will be omitted.

Figure 30:
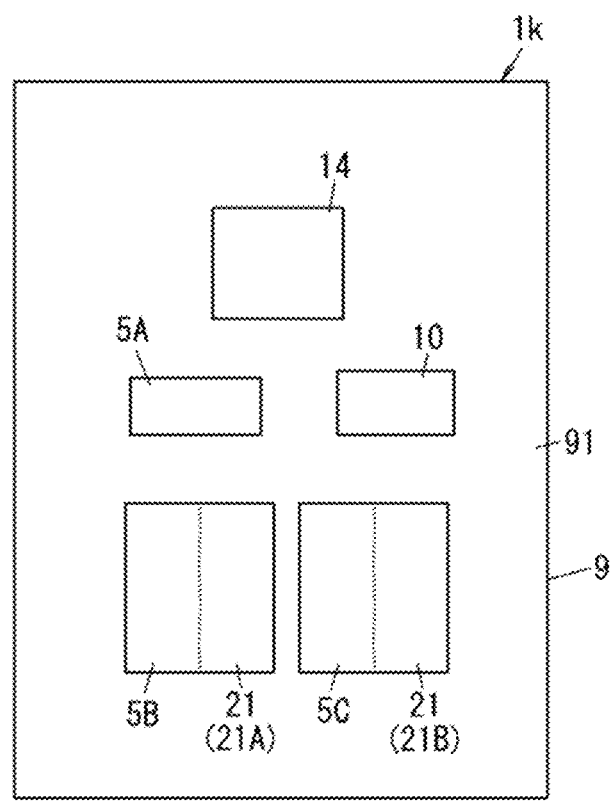
FIG. 30 is a plan view of a radio-frequency module of a second modified example of the fourth embodiment.
Figure 32A:
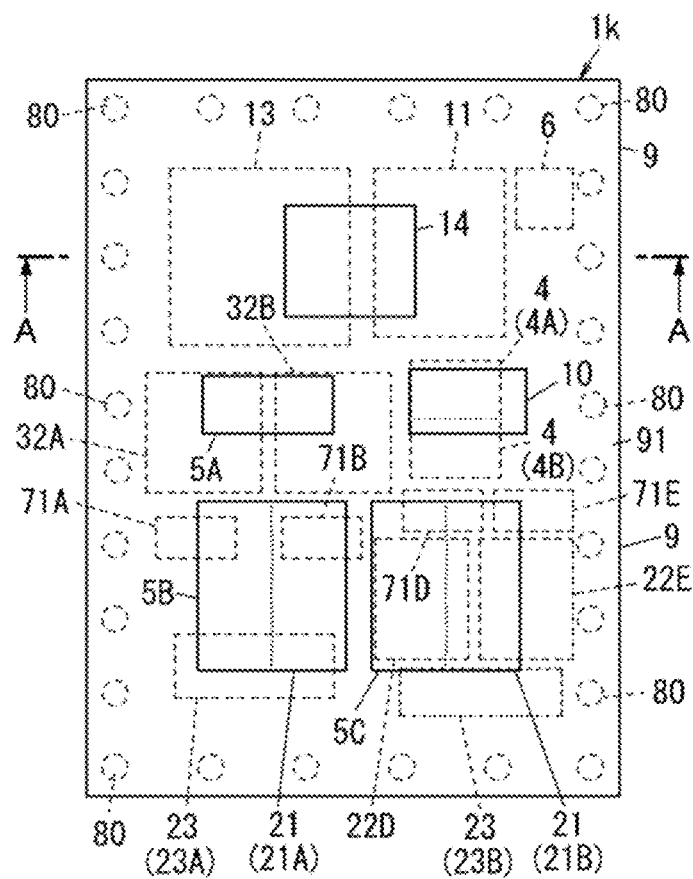
FIG. 32A is a plan view of the radio-frequency module of the second modified example of the fourth embodiment with the electronic components and multiple external connecting terminals disposed on the second main surface indicated by the broken lines.
Figure 32B:
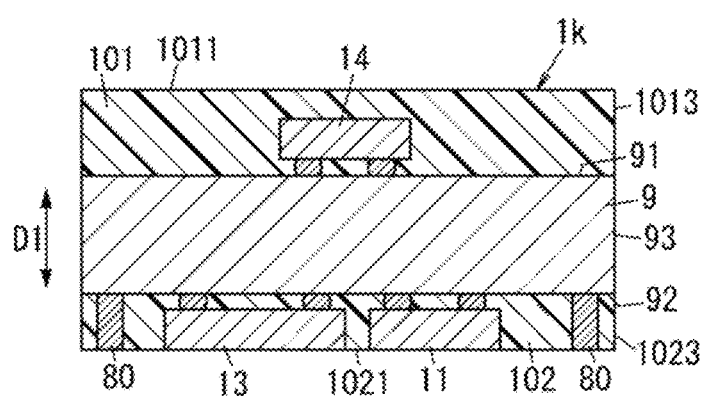
FIG. 32B is a sectional view of the radio-frequency module of the second modified example of the fourth embodiment taken along line A-A in FIG. 32A.

In the radio-frequency module 1k, as shown in FIGS. 30, 32A, and 32B, the multiplexer 10, the controller 14, the three second switches 5A, 5B, and 5C, and the two low-noise amplifiers 21 are disposed on the first main surface 91 of the mounting substrate 9.

Figure 31:
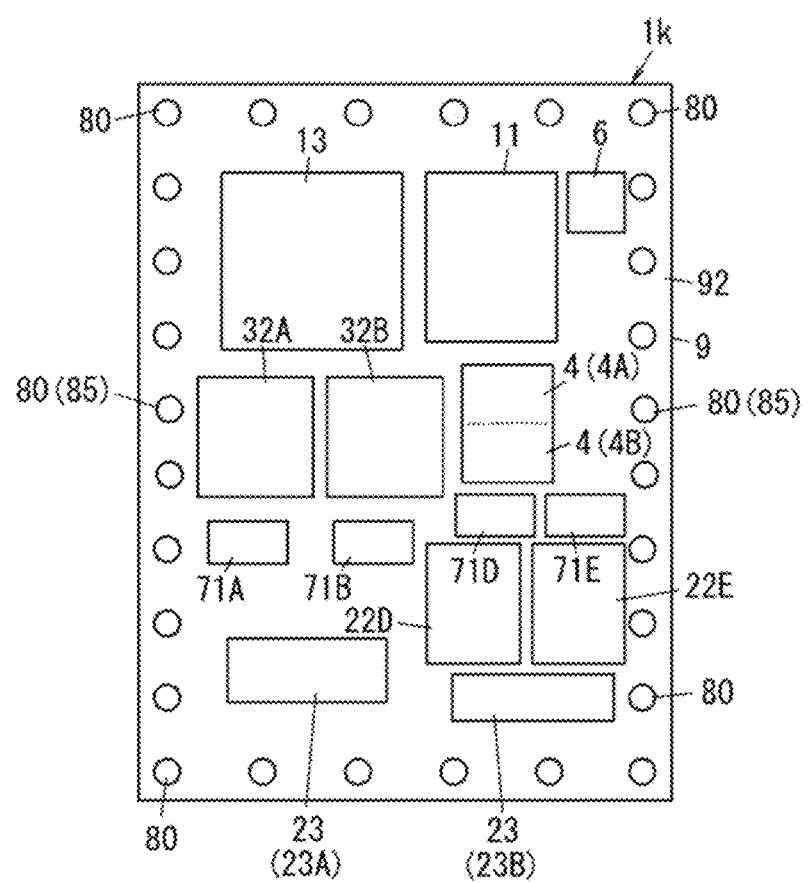
FIG. 31 is a plan view of the radio-frequency module of the second modified example of the fourth embodiment when a second main surface of a mounting substrate and electronic components and multiple external connecting terminals disposed on the second main surface are seen through from a first main surface of the mounting substrate.

In the radio-frequency module 1k, as shown in FIGS. 31, 32A, and 32B, the first switches 4A and 4B, the switch 6, and the power amplifier 11 are disposed on the second main surface 92 of the mounting substrate 9. The first switches 4A and 4B are formed into one chip, but may be formed as different chips. In the radio-frequency module 1k, elements (circuit elements) forming the four matching circuits 71A, 71B, 71D, and 71E, the output matching circuit 13, and the first and second input matching circuits 23A and 23B are disposed on the second main surface 92 of the mounting substrate 9. The two duplexers 32A and 32B and the two receive filters 22D and 22E are also disposed on the second main surface 92 of the mounting substrate 9.

The radio-frequency module 1k according to the second modified example of the fourth embodiment includes the mounting substrate 9, the power amplifier 11, and the controller 14. The mounting substrate 9 has the first and second main surfaces 91 and 92 opposing each other. The power amplifier 11 is disposed on one of the first and second main surfaces 91 and 92 (the second main surface 92, in this example) of the mounting substrate 9. The controller 14 is disposed on the other one of the first and second main surfaces 91 and 92 (the first main surface 91, in this example) of the mounting substrate 9. The controller 14 controls the power amplifier 11.

The radio-frequency module 1k is able to control the power amplifier 11 more stably.

In the radio-frequency module 1k, as shown in FIGS. 32A and 32B, the footprint of the power amplifier 11 and the footprint of the controller 14 at least partially overlap in the thickness direction D1 of the mounting substrate 9. More specifically, the footprint of the power amplifier 11 and the footprint of the controller 14 do not completely match each other but only partially overlap each other, in the thickness direction D1 of the mounting substrate 9. This makes it possible to reduce the length of wiring connecting the controller 14 and the power amplifier 11 while making it less likely to transfer heat from the power amplifier 11 to the controller 14.

(Aspects)

The specification discloses the following aspects.

According to a first aspect, a radio-frequency module 1, 1a, 1b, 1c, 1d, 1e, 1f, 1g, 1h, 1i, 1j, or 1k includes a mounting substrate 9, a power amplifier 11, and a controller 14. The mounting substrate 9 has first and second main surfaces 91 and 92 opposing each other. The power amplifier 11 is disposed on one of the first and second main surfaces 91 and 92 of the mounting substrate 9. The controller 14 is disposed on the other one of the first and second main surfaces 91 and 92 of the mounting substrate 9. The controller 14 controls the power amplifier 11.

The radio-frequency module 1, 1a, 1b, 1c, 1d, 1e, 1f, 1g, 1h, 1i, 1j, or 1k according to the first aspect is able to control the power amplifier 11 more stably.

According to a second aspect, the radio-frequency module 1, 1a, 1b, 1c, 1d, 1e, 1f, 1h, 1i, or 1j according to the first aspect further includes plural external connecting terminals 80 disposed on the second main surface 92 of the mounting substrate 9. The power amplifier 11 is disposed on the first main surface 91 of the mounting substrate 9. The controller 14 is disposed on the second main surface 92 of the mounting substrate 9.

The radio-frequency module 1, 1a, 1b, 1c, 1d, 1e, 1f, 1h, 1i, or 1j according to the second aspect can easily dissipate heat generated in the power amplifier 11.

According to a third aspect, the radio-frequency module 1g or 1k according to the first aspect further includes plural external connecting terminals 80 disposed on the second main surface 92 of the mounting substrate 9. The power amplifier 11 is disposed on the second main surface 92 of the mounting substrate 9. The controller 14 is disposed on the first main surface 91 of the mounting substrate 9.

The radio-frequency module 1g or 1k according to the third aspect can dissipate heat generated in the power amplifier 11 via a circuit substrate, for example, on which the radio-frequency module 1g or 1k is mounted.

According to a fourth aspect, the radio-frequency module 1f, 1g, or 1h according to the second or third aspect includes plural power amplifiers 11. The controller 14 controls the plural power amplifiers 11.

The radio-frequency module 1f, 1g, or 1h according to the fourth aspect is able to control the plural power amplifiers 11 more stably.

According to a fifth aspect, in the radio-frequency module 1f, 1g, or 1h according to the fourth aspect, the frequency band of a transmit signal amplified by each of the plural power amplifiers 11 is different from that amplified by another one of the plural power amplifiers 11.

The radio-frequency module 1f, 1g, or 1h according to the fifth aspect is able to improve the performance of each of the plural power amplifiers 11.

According to a sixth aspect, in the radio-frequency module 1, 1a, 1b, 1c, 1d, 1e, 1f, 1g, 1h, 1i, 1j, or 1k according to one of the second through fifth aspects, the plural external connecting terminals 80 include a control terminal 84. The controller 14 controls the power amplifier 11 based on a control signal obtained via the control terminal 84.

According to the sixth aspect, the radio-frequency module 1, 1a, 1b, 1c, 1d, 1e, 1f, 1g, 1h, 1i, 1j, or 1k is able to control the power amplifier 11 more stably.

According to a seventh aspect, in the radio-frequency module 1, 1a, 1b, 1c, 1d, 1e, 1f, 1g, 1h, 1i, 1j, or 1k according to the sixth aspect, the plural external connecting terminals 80 include plural control terminals 84. The plural control terminals 84 support the MIPI standard. The controller 14 supports the MIPI standard and has plural terminals 148 connected to the plural control terminals 84.

In the radio-frequency module 1, 1a, 1b, 1c, 1d, 1e, 1f, 1g, 1h, 1i, 1j, or 1k according to the seventh aspect, a control signal based on the MIPI standard is less vulnerable to the interference of other signals.

According to an eighth aspect, in the radio-frequency module 1, 1a, 1b, 1c, 1d, 1e, 1f, 1g, 1h, 1i, 1j, or 1k according to one of the first through seventh aspects, the mounting substrate 9 also includes a via-electrode 95. The via-electrode 95 is formed along a thickness direction D1 of the mounting substrate 9 and is connected to the power amplifier 11.

The radio-frequency module 1, 1a, 1b, 1c, 1d, 1e, 1f, 1g, 1h, 1i, 1j, or 1k according to the eighth aspect can more easily dissipate heat generated in the power amplifier 11.

According to a ninth aspect, in the radio-frequency module 1, 1a, 1b, 1c, 1d, 1e, 1f, 1g, or 1h according to one of the first through eighth aspects, the footprint of the power amplifier 11 and the footprint of the controller 14 do not overlap each other, as viewed in the thickness direction D1 of the mounting substrate 9.

The radio-frequency module 1, 1a, 1b, 1c, 1d, 1e, 1f, 1g, or 1h according to the ninth aspect is able to enhance the isolation between the power amplifier 11 and the controller 14.

According to a tenth aspect, the radio-frequency module 1, 1a, 1b, 1c, 1d, 1e, 1i, 1j, or 1k according to one of the first through ninth aspects further includes plural transmit filters 12A, 12B, and 12C and a band select switch (second switch 5). Each of the plural transmit filters 12A, 12B, and 12C uses the transmit frequency band of a communication band as the pass band. The communication band used by each of the plural transmit filters 12A, 12B, and 12C is different from that used by another one of the plural transmit filters 12A, 12B, and 12C. The band select switch (second switch 5) is disposed on one of the first and second main surfaces 91 and 92 of the mounting substrate 9 and is connected between the power amplifier 11 and the plural transmit filters 12A, 12B, and 12C. The controller 14 controls the band select switch (second switch 5).

According to an eleventh aspect, the radio-frequency module 1b according to the tenth aspect further includes an IC chip 7 integrating the controller 14 and the band select switch (second switch 5).

In the radio-frequency module 1b according to the eleventh aspect, fewer components are required than those in the configuration in which the controller 14 and the band select switch (second switch 5) are formed as different IC chips.

According to a twelfth aspect, in the radio-frequency module 1, 1a, 1b, 1c, 1d, 1e, 1f, 1g, 1h, 1i, 1j, or 1k according to one of the second through sixth aspects, the plural external connecting terminals 80 include an antenna terminal 81. The radio-frequency module 1, 1a, 1b, 1c, 1d, 1e, 1f, 1g, 1h, 1i, 1j, or 1k further includes an antenna switch (first switch 4). The antenna switch (first switch 4) is disposed on one of the first and second main surfaces 91 and 92 of the mounting substrate 9 and is connected to the antenna terminal 81. The controller 14 controls the antenna switch (first switch 4).

According to a thirteenth aspect, the radio-frequency module 1d according to the twelfth aspect further includes an IC chip 3 integrating the controller 14 and the antenna switch (first switch 4).

In the radio-frequency module 1d according to the thirteenth aspect, fewer components are required than those in the configuration in which the controller 14 and the antenna switch (first switch 4) are formed as different IC chips.

According to a fourteenth aspect, the radio-frequency module 1, 1a, 1b, 1c, 1d, 1e, 1f, 1g, 1h, 1i, 1j, or 1k according to one of the first through thirteenth aspects further includes a low-noise amplifier 21. The low-noise amplifier 21 is disposed on the other one of the first and second main surfaces 91 and 92 of the mounting substrate 9. That is, the low-noise amplifier 21 is disposed on the main surface different from that on which the power amplifier 11 is disposed. The footprint of the power amplifier 11 and the footprint of the low-noise amplifier 21 do not overlap each other, as viewed in the thickness direction D1 of the mounting substrate 9.

The radio-frequency module 1, 1a, 1b, 1c, 1d, 1e, 1f, 1g, 1h, 1i, 1j, or 1k according to the fourteenth aspect is able to enhance the isolation between the power amplifier 11 and the low-noise amplifier 21.

According to a fifteenth aspect, a communication device 300, 300f, or 300i includes the radio-frequency module 1, 1a, 1b, 1c, 1d, 1e, 1f, 1g, 1h, 1i, 1j, or 1k according to one of the first through fourteenth aspects and a signal processing circuit 301. The signal processing circuit 301 is connected to the radio-frequency module 1, 1a, 1b, 1c, 1d, 1e, 1f, 1g, 1h, 1i, 1j, or 1k.

The communication device 300, 300f, or 300i according to the fifteenth aspect is able to control the power amplifier 11 more stably.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio-frequency module comprising:
    a mounting substrate having first and second main surfaces opposing each other;
    a first power amplifier disposed on one of the first and second main surfaces of the mounting substrate; and
    a controller that is disposed on the other one of the first and second main surfaces of the mounting substrate and configured to control the first power amplifier.

2. The radio-frequency module of claim 1, further comprising:
    a plurality of external connecting terminals disposed on the second main surface of the mounting substrate.

3. The radio-frequency module of claim 2, wherein
    the first power amplifier is disposed on the first main surface of the mounting substrate, and
    the controller is disposed on the second main surface of the mounting substrate.

4. The radio-frequency module of claim 2, wherein
    the first power amplifier is disposed on the second main surface of the mounting substrate, and
    the controller is disposed on the first main surface of the mounting substrate.

5. The radio-frequency module of claim 2, wherein
    the plurality of external connecting terminals include a control terminal, and
    the controller is configured to control the first power amplifier based on a control signal obtained via the control terminal.

6. The radio-frequency module of claim 2, wherein
    the plurality of external connecting terminals include a plurality of control terminals that support a mobile industry processor interface standard.

7. The radio-frequency module of claim 6, wherein
    the controller includes a plurality of terminals connected to the plurality of control terminals and is configured to support the mobile industry processor interface standard.

8. The radio-frequency module of claim 2, wherein
    the plurality of external connecting terminals include an antenna terminal.

9. The radio-frequency module of claim 8, further comprising:
    an antenna switch that is disposed on one of the first and second main surfaces of the mounting substrate and is connected to the antenna terminal, wherein
    the controller controls the antenna switch.

10. The radio-frequency module of claim 9, further comprising:
    an integrated circuit chip including the controller and the antenna switch.

11. The radio-frequency module of claim 1, further comprising:
    a plurality of power amplifiers including the first power amplifier, wherein
    the controller is configured to control the plurality of power amplifiers.

12. The radio-frequency module of claim 11, wherein
    a frequency band of a transmit signal amplified by each of the plurality of the power amplifiers is different from a frequency band of a transmit signal amplified by another one of the plurality of the power amplifiers.

13. The radio-frequency module of claim 1, wherein
    the mounting substrate includes a via-electrode that is formed along a thickness direction of the mounting substrate and is connected to the first power amplifier.

14. The radio-frequency module of claim 1, wherein
    a footprint of the first power amplifier and a footprint of the controller do not overlap, as viewed in a thickness direction of the mounting substrate.

15. The radio-frequency module of claim 1, further comprising:
    a plurality of transmit filters, each of which uses a transmit frequency band of a communication band as a pass band, a communication band used by each of the plurality of transmit filters being different from a communication band used by another one of the plurality of transmit filters.

16. The radio-frequency module of claim 15, further comprising:
    a band select switch that is disposed on one of the first and second main surfaces of the mounting substrate and is connected between the first power amplifier and the plurality of transmit filters, wherein
    the controller controls the band select switch.

17. The radio-frequency module of claim 16, further comprising:
    an integrated circuit chip including the controller and the band select switch.

18. The radio-frequency module of claim 1, further comprising:
    a low-noise amplifier disposed on the other one of the first and second main surfaces of the mounting substrate, wherein
    a footprint of the first power amplifier and a footprint of the low-noise amplifier do not overlap, as viewed in a thickness direction of the mounting substrate.

19. A communication device comprising:
    a radio-frequency module including
        a mounting substrate having first and second main surfaces opposing each other;
        a power amplifier disposed on one of the first and second main surfaces of the mounting substrate; and
        a controller that is disposed on the other one of the first and second main surfaces of the mounting substrate and configured to control the power amplifier; and
    a signal processing circuit connected to the radio-frequency module.

20. A radio-frequency module comprising:
    a mounting substrate having first surface and a second surface on opposite sides of the mounting substrate;
    a plurality of external connecting terminal disposed on the second main surface of the mounting substrate;
    a power amplifier disposed on the first surface of the mounting substrate; and
    a controller that is disposed on the second main surface and configured to control the power amplifier based on a signal received via one of the plurality of external connecting terminals, wherein when the mounting substrate is viewed in a plan view, a footprint of the power amplifier does not overlap a footprint of the controller.

\* \* \* \* \*